(12) United States Patent
Hiratani

(10) Patent No.: US 10,969,543 B2
(45) Date of Patent: Apr. 6, 2021

(54) SEMICONDUCTOR INTEGRATED OPTICAL DEVICE, AND METHOD OF FABRICATING SEMICONDUCTOR INTEGRATED OPTICAL DEVICE

(71) Applicant: SUMITOMO ELECTRIC INDUSTRIES, LTD., Osaka (JP)

(72) Inventor: Takuo Hiratani, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/831,895

(22) Filed: Mar. 27, 2020

(65) Prior Publication Data
US 2020/0326476 A1 Oct. 15, 2020

(30) Foreign Application Priority Data
Apr. 11, 2019 (JP) .............................. JP2019-075578

(51) Int. Cl.
*G02B 6/12* (2006.01)
*G02B 6/136* (2006.01)
*H01S 5/00* (2006.01)

(52) U.S. Cl.
CPC ..... *G02B 6/12002* (2013.01); *G02B 6/12004* (2013.01); *G02B 6/136* (2013.01); *H01S 5/0085* (2013.01); *G02B 2006/12176* (2013.01); *G02B 2006/12178* (2013.01)

(58) Field of Classification Search
CPC ............ G02B 6/12002; G02B 6/12004; G02B 6/122; G02B 6/136; H01S 5/00; H01S 5/026; H01S 5/0085; H01S 5/1014; H01S 5/1017; H01S 5/12; H01S 5/1231; H01S 5/125; H01S 5/209; H01S 5/2275; H01S 5/3402

USPC ...................................... 385/14, 37, 129–132
See application file for complete search history.

(56) References Cited

U.S. PATENT DOCUMENTS

| | | | | |
|---|---|---|---|---|
| 8,792,756 B2 * | 7/2014 | Takiguchi | ............... | G02B 6/122 385/14 |
| 9,780,530 B2 * | 10/2017 | Adachi | .................... | H01S 5/209 |
| 9,825,430 B2 * | 11/2017 | Tsuji | ..................... | H01S 5/2275 |

OTHER PUBLICATIONS

Takahiko Shindo et al., "High Modulated Output Power Over 9.0 dBm with 1570-nm Wavelength SOA Assisted Extended Reach EADFB Laser (AXEL)", IEEE Journal of Selected Topics in Quantum Electronics, vol. 23, No. 6, Dec. 2017.

* cited by examiner

*Primary Examiner* — Michael P Mooney
(74) *Attorney, Agent, or Firm* — Oliff PLC

(57) ABSTRACT

A semiconductor integrated optical device includes a waveguide mesa having a first multilayer including a first core layer, a second multilayer including a second core layer, and a butt joint interface between the first core layer and the second core layer; a support having first to third regions; and a buried semiconductor region provided on the support. The first multilayer has a first mesa width on the first region. The second multilayer has a second mesa width on the second region. On the third region, the second multilayer has a waveguide portion having a third mesa width smaller than the first and the second mesa widths. The second core layer has a waveguide core thickness on the second region. In the waveguide portion, the second core layer has a core portion having a thickness different from the waveguide core thickness at a position away from the butt-joint interface.

5 Claims, 13 Drawing Sheets

SEMICONDUCTOR INTEGRATED OPTICAL DEVICE, AND METHOD OF FABRICATING SEMICONDUCTOR INTEGRATED OPTICAL DEVICE

CROSS REFERENCE TO RELATED APPLICATIONS

The present application is based upon and claims the benefit of the priority from Japanese patent application No. 2019-075578, filed on Apr. 11, 2019, which is hereby incorporated by reference in its entirety.

TECHNICAL FIELD

The present disclosure relates to a semiconductor integrated optical device and a method of fabricating the semiconductor integrated optical device.

BACKGROUND

Non-Patent Document 1 discloses a ridge-type integrated optical device including a laser element and a modulation element.

Non-Patent Document 1: Takahiko Shindo, et. al. "High Modulated Output Power Over 9.0 dBm With 1570-nm Wavelength SOA Assisted Extended Reach EADFB Laser (AXEL)" IEEE JOURNAL OF SELECTED TOPICS IN QUANTUM ELECTRONICS, VOL. 23, NO. 6, NOVEMBER/DECEMBER 2017

SUMMARY

The present disclosure provides a semiconductor integrated optical device including: a waveguide mesa having a first multilayer including a first core layer of a first element, a second multilayer including a second core layer of a second element, and a butt-joint interface between the first core layer and the second core layer; a support having a first region, a second region, and a third region, the support mounting the waveguide mesa; and a buried semiconductor region provided on the support, wherein the third region is provided between the first region and the second region, the first multilayer extends from the butt-joint interface in a direction from the third region to the first region, the second multilayer extends from the butt joint interface in a direction from the third region to the second region, the first multilayer has a first mesa width on the first region, the second multilayer has a second mesa width on the second region, on the third region, the second multilayer has a waveguide portion having a third mesa width smaller than the first mesa width and the second mesa width, the second core layer has a waveguide core thickness on the second region, in the waveguide portion, the second core layer has a core portion having a thickness different from the waveguide core thickness at a position away from the butt-joint interface.

The present disclosure also provides a method of fabricating a semiconductor integrated optical device including the steps of: preparing an epitaxial substrate, the epitaxial substrate including a first multilayer for a first element, a second multilayer including a second core layer for a second element, a butt-joint interface between the first and second multilayers, and a substrate having a first region, a second region, and a third region, the third region being provided between the first region and the second region; forming a waveguide mask on the epitaxial substrate, the waveguide mask having a waveguide pattern extending across the butt-joint interface in a direction from the first multilayer to the second multilayer; and forming a waveguide mesa by etching the epitaxial substrate using the waveguide mask, the waveguide mesa having the first multilayer, the second multilayer, and the butt joint interface, the first multilayer extending from the butt-joint interface in a direction from the third region to the first region, the second multilayer extending from the butt joint interface in a direction from the third region to the second region, the first multilayer having a first mesa width on the first region, the second multilayer having a second mesa width on the second region, on the third region, the second multilayer having a waveguide portion having a third mesa width smaller than the first mesa width and the second mesa width, the second core layer having a waveguide core thickness on the second region, in the waveguide portion, the second core layer has a core portion having a thickness different from the waveguide core thickness at a position away from the butt-joint interface.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION

Figure 1A:
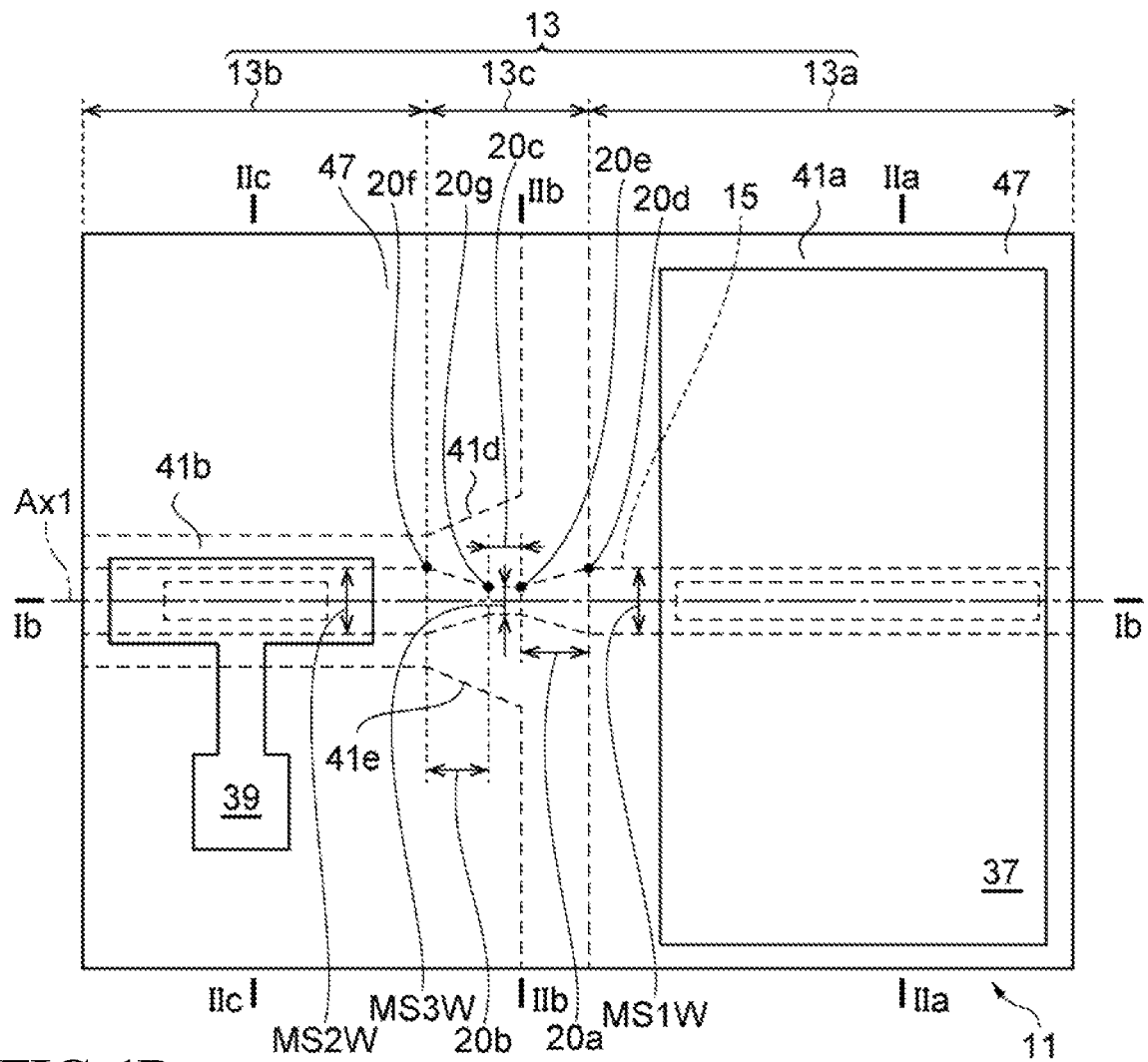
FIG. 1A is a plan view showing a semiconductor integrated optical device according to the present embodiment.

Problem to be Solved by the Present Disclosure

A semiconductor integrated optical device for monolithically integrating a waveguide element and an optical element having a different waveguide structure includes a waveguide mesa of the waveguide element, a waveguide mesa of the optical element, and a butt-joint interface of the two waveguide mesas. The butt-joint interface scatters light across the interface causing optical loss. The structure of the butt-joint interface exhibits additional light loss beyond that due to light scattering by the interface.

An object of one aspect of the present disclosure is to provide a semiconductor integrated optical device having a structure capable of reducing optical loss. Another object of the present disclosure is to provide a method of fabricating the semiconductor integrated optical device.

Description of Embodiments of the Present Disclosure

Several specific examples are described.

A semiconductor integrated optical device according to a specific example comprises: (a) a waveguide mesa having a first multilayer including a first core layer of a first element, a second multilayer including a second core layer of a second element, and a butt-joint interface between the first core layer and the second core layer; (b) a support having a first region, a second region, and a third region, the support mounting the waveguide mesa; and (c) a buried semiconductor region provided on the support. The third region is provided between the first region and the second region. The first multilayer extends from the butt-joint interface in a direction from the third region to the first region. The second multilayer extends from the butt-joint interface in a direction from the third region to the second region. The first multilayer has a first mesa width on the first region. The second multilayer has a second mesa width on the second region. On the third region, the second multilayer has a waveguide portion having a third mesa width smaller than the first mesa width and the second mesa width. In the waveguide portion, the second core layer has a core portion having a thickness different from the waveguide core thickness at a position away from the butt-joint interface.

According to the semiconductor integrated optical device, a waveguide portion having a mesa width smaller than the first mesa width and the second mesa width is provided in the second multilayer on the third region. The waveguide portion is located away from the butt-joint interface, and the second multilayer includes a core portion of a thickness different from the waveguide core thickness of the second core layer. The waveguide portion can provide a large mode field diameter in the third region to light propagating through the waveguide mesa.

In a semiconductor integrated optical device according to a specific example, the waveguide mesa has a lower cladding layer provided on the first region, the second region, and the third region and shared by the first and second multilayers. The first core layer and the second core layer are provided on the lower cladding layer. The first multilayer has a first upper cladding layer on the first core layer. The second multilayer has a second upper cladding layer on the second core layer. The second core layer is provided on an end surface of the first upper cladding layer and on an end surface of the first core layer in the butt-joint interface. The core portion is provided on the lower cladding layer. The waveguide mesa has a third upper cladding layer on the first region, the second region, and the third region. The first and second multilayers share the third upper cladding layer.

According to the semiconductor integrated optical device, the core portion is not applied to the second core layer on the end face of the first upper cladding layer, but is applied to the second core layer on the lower cladding layer on the third region. The second core layer has a film thickness varying in the direction of the waveguide axis on the lower cladding layer shared by the first element and the second element. The third upper cladding layer extends over the upper surface of the first upper cladding layer and the upper surface of the second upper cladding layer, and is shared by the first element and the second element. The first core layer and the second core layer are arranged in series in the direction of the waveguide axis, and the arrangement is arranged between the lower cladding layer and the third upper cladding layer. This arrangement does not increase the height of the butt-joint interface.

The semiconductor integrated optical device according to the specific example further includes a first electrode connected to the first multilayer on the first region and a second electrode connected to the second multilayer on the second region. The first core layer includes an active layer of a light emitting element. The second core layer includes a light absorbing layer of an electro-absorption modulator.

According to the semiconductor integrated optical device, the electro-absorption modulator can be integrated with the light emitting element.

A method of fabricating a semiconductor integrated optical device according to a specific example includes the steps of: (a) preparing an epitaxial substrate including a first multilayer for a first element, a second multilayer including a second core layer for a second element, a butt-joint interface between the first and second multilayers, and a substrate having a first region, a second region, and a third region, the third region being provided between the first region and the second region; (b) forming a waveguide mask on the epitaxial substrate, the waveguide mask having a waveguide pattern extending across the butt-joint interface in a direction from the first multilayer to the second multilayer; (c) forming a waveguide mesa by etching the epitaxial substrate using the waveguide mask, the waveguide mesa having the first multilayer, the second multilayer, and the butt-joint interface. The first multilayer extends from the butt-joint interface in a direction from the third region to the first region. The second multilayer extends from the butt-joint interface in a direction from the third region to the second region. The first multilayer has a first mesa width on the first region. The second multilayer has a second mesa width on the second region. On the third region, the second multilayer has a waveguide portion having a third mesa width smaller than the first and second mesa widths. The second core layer has a waveguide core thickness on the second region. In the waveguide portion, the second core layer has a core portion having a thickness different from the waveguide core thickness at a position away from the butt-joint interface.

According to the method of fabricating the semiconductor integrated optical device, the second core layer on the third region has a film thickness different from the film thickness of on the second region. The change in thickness in the third region may cause an absorption loss to the light propagating through the waveguide mesa on the third region. The second multilayer of the waveguide mesa on the third region is provided with a portion of the third mesa width that is less than the first and second mesa widths so that the mode field diameter of the waveguide mesa on the third region is greater than the mode field diameter of the waveguide mesas on the first and second regions. Thus, the absorption loss can be reduced.

In the method of fabricating a semiconductor integrated optical device according to the specific example, the step of preparing the epitaxial substrate includes the steps of: (a1) growing a lower laminate on the first to the third regions, the lower laminate including a lower cladding layer for the first and second elements, a first core layer for the first element, and a first upper cladding layer for the first element; (a2) forming a mask on the lower laminate, the mask covering the first region, the mask having an opening on the second and third regions; (a3) etching the lower laminate using the mask to form a butt-joint mesa on the first region; and (a4) selectively growing an upper laminate using the mask to form the butt-joint interface, the upper laminate including the second core layer for the second element and a second upper cladding layer for the second element. The second core layer has a composition on the third region different from a composition at the position away from the butt-joint interface.

According to the method of fabricating the semiconductor integrated optical device, in the selectively growing of the second laminate, the second core layer is grown so that the core portion of the second core layer on the third region has a semiconductor composition different from the composition of the core layer on the second region. The second core layer is grown not only on the lower cladding layer but also on the end face of the first laminate. The change in film thickness and composition in the core portion causes the absorption loss of light propagating through the waveguide mesa on the third region. The change in composition shifts the bandgap wavelength of the core layer to a longer wavelength.

The findings of the present disclosure can be readily understood by consideration of the following detailed description with reference to the accompanying drawings, which are given by way of illustration and in which: Embodiments of a semiconductor integrated optical device and a method of fabricating the semiconductor integrated optical device will be described with reference to the accompanying drawings. Wherever possible, the same parts are denoted by the same reference numerals.

Figure 1B:
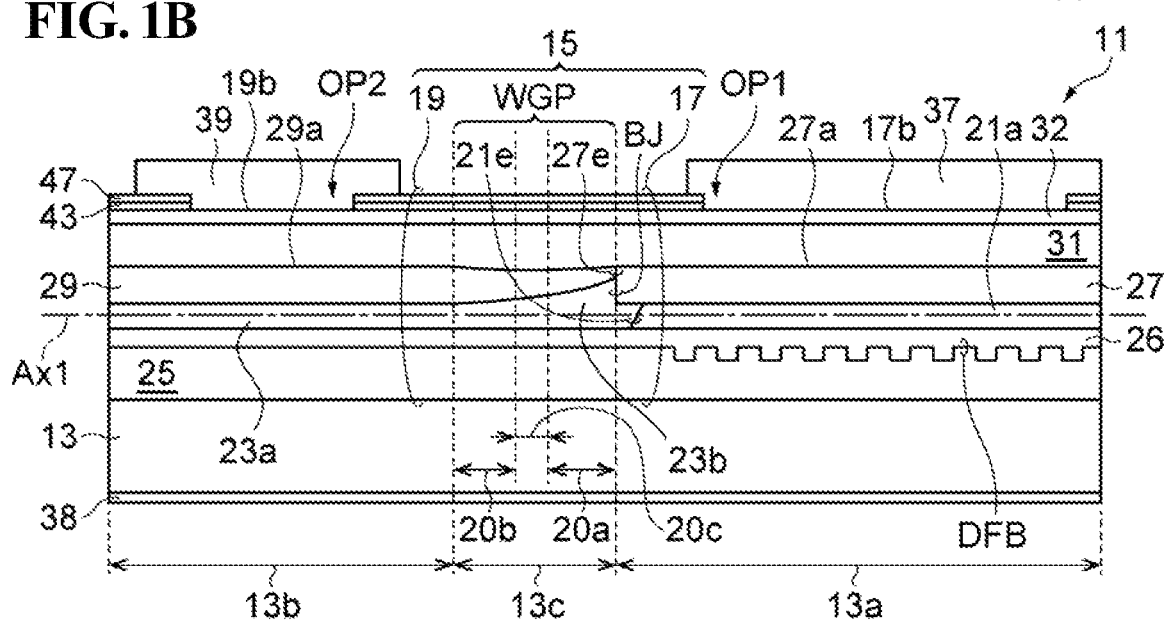
FIG. 1B is a diagram showing a cross-section taken along the Ib-Ib line shown in FIG. 1A.
Figure 2A:
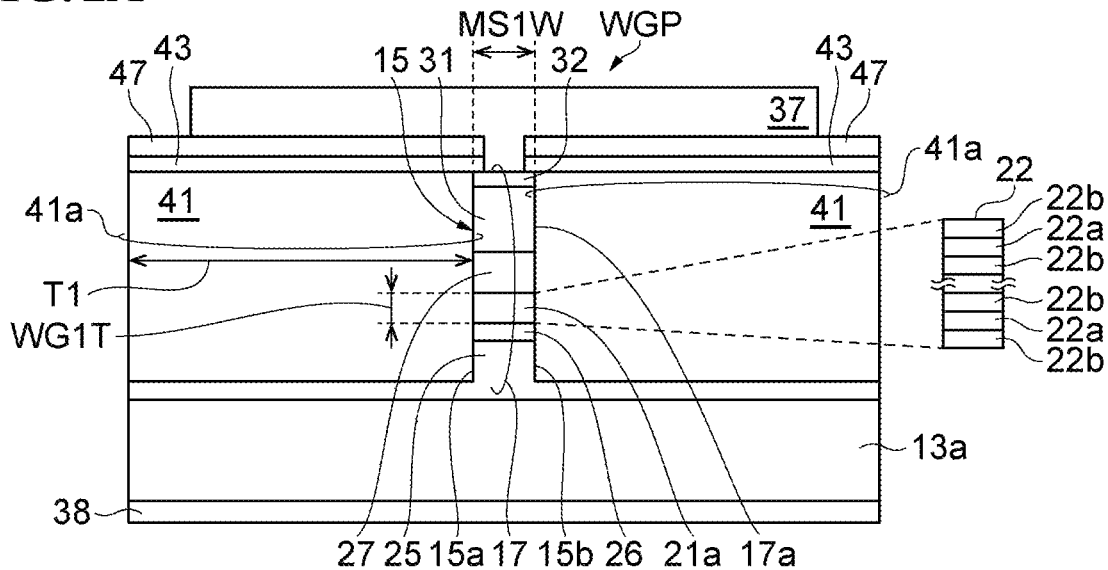
FIG. 2A is a diagram showing a cross-section taken along the IIa-IIa line shown in FIG. 1A.
Figure 2B:
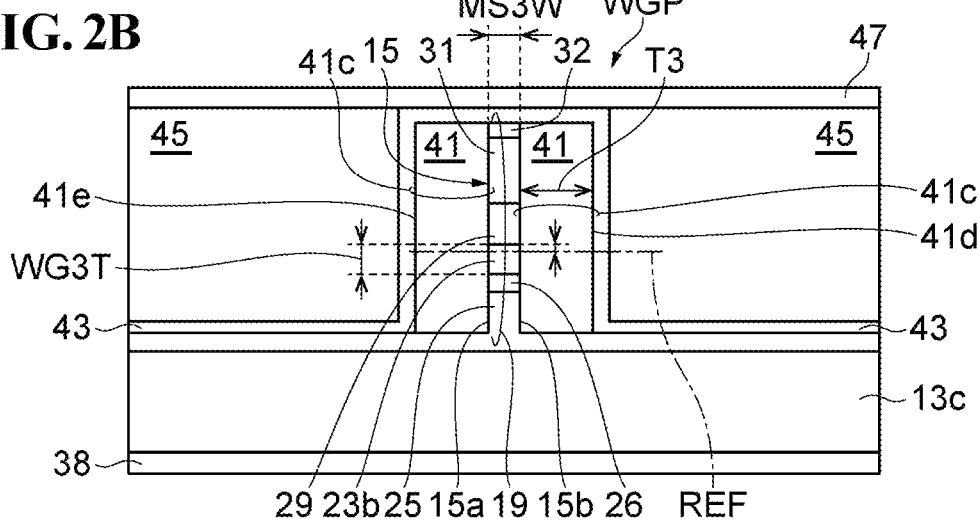
FIG. 2B is a diagram showing a cross-section taken along the IIb-IIb line shown in FIG. 1A.
Figure 2C:
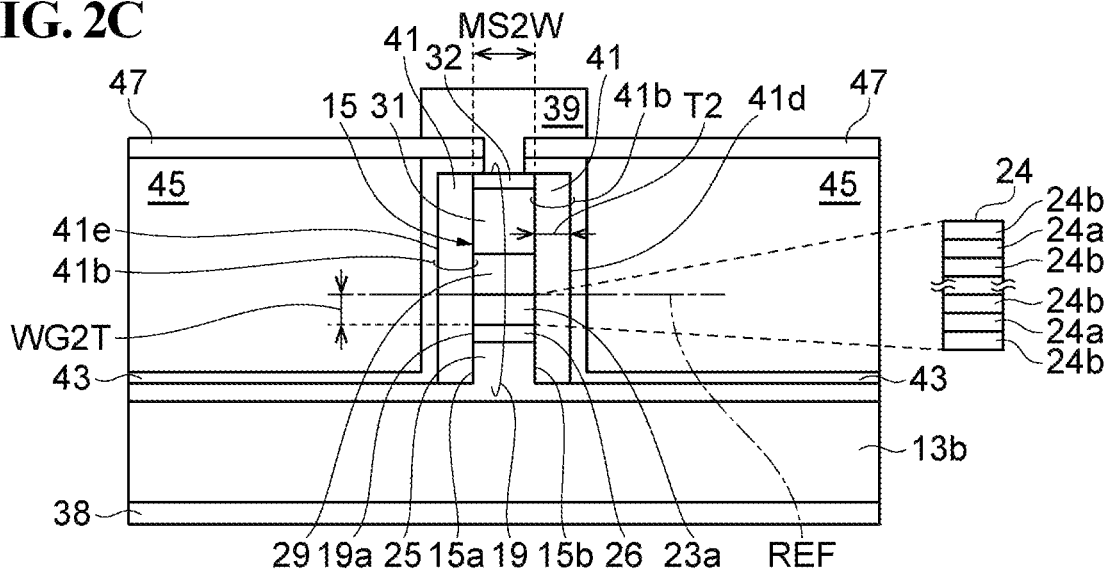
FIG. 2C is a diagram showing a cross-section taken along the IIc-IIc line shown in FIG. 1A.

FIG. 1A is a plan view showing a semiconductor integrated optical device according to the present embodiment. FIG. 1B is a diagram showing a cross-section taken along the Ib-Ib line shown in FIG. 1A. FIG. 2A, FIG. 2B and FIG. 2C are diagrams showing cross-sections taken along the IIa-IIa line, the IIb-IIb line and the IIc-IIc line shown in FIG. 1A, respectively.

The semiconductor integrated optical device 11 monolithically integrates a first element and a second element. Each of the first element and the second element may have an active element of a waveguide type.

The semiconductor integrated optical device 11 includes a support 13 and a waveguide mesa 15. The support 13 has a first region 13a, a second region 13b, and a third region 13c. The first region 13a, the second region 13b, and the third region 13c are arranged along an axis Ax1. The third region 13c is provided between the first region 13a and the second region 13b. The waveguide mesa 15 has a first multilayer 17, a second multilayer 19, and a butt-joint interface BJ. The first multilayer 17 extends from the butt-joint interface BJ to the first region 13a in the direction from the third region 13c to the first region 13a. The second multilayer 19 extends from the butt joint interface BJ to the second region 13b in the direction from the third region 13c to the second region 13b.

The first multilayer 17 includes a first core layer 21a of the first element, and the second multilayer 19 includes a second core layer 23a of the second element. The first core layer 21a and the second core layer 23a form the butt-joint interface BJ on the third region 13c. The first core layer 21a and the second core layer 23a meet to form the butt-joint interface BJ, and this interface creates a refractive index difference between the first multilayer 17 and the second multilayer 19.

Referring to FIGS. 1A, 2A, 2B, and 2C, the first multilayer 17 has a first mesa width MS1W on the first region 13a. The second multilayer 19 has a second mesa width MS2W on the second region 13b. The second multilayer 19 has a waveguide portion WGP having a third mesa width MS3W smaller than the first mesa width MS1W and the second mesa width MS2W on the third area 13c.

The first core layer 21a has a first waveguide core thickness WG1T on the first region 13a. The second core layer 23a has a second waveguide core thickness WG2T on the second regions 13b. The second core layer 23a has a core portion 23b on the third region 13c, and the core portion 23b has a third waveguide core thickness WG3T that differs from the second waveguide core thickness WG2T at a position away from the butt-joint interface BJ. The third waveguide core thickness WG3T is larger than the second waveguide core thickness WG2T shown as a reference line REF.

The semiconductor integrated optical device 11 includes a buried semiconductor region 41 provided on the support 13. The buried semiconductor region 41 has a high resistivity. The buried semiconductor region 41 includes a semi-insulating semiconductor having a specific resistance higher than that of the first core layer 21a and the second core layer 23a.

As described above, the second multilayer 19 has the waveguide portion WGP having the third mesa width MS3W on the third region 13c. The buried semiconductor region 41 embeds the waveguide portion WGP of the waveguide mesa 15. Specifically, in the waveguide portion WGP, the buried semiconductor region 41 is provided on side surfaces 15a, 15b of the waveguide mesa 15.

The waveguide portion WGP is located away from the butt-joint interface BJ. The second multilayer 19 has the core portion 23b having the third waveguide core thickness WG3T on the third region 13c. The third waveguide core thickness WG3T is different from the second waveguide core thickness WG2T of the second core 23a on the second region 13b.

The waveguide portion WGP provides light propagating through the waveguide mesa 15 with a large mode field diameter in the third region 13c. The large mode field diameter is larger than the mode field diameter in the first multilayer 17 or in the second multilayer 19. The narrow width of the waveguide portion WGP on the third region 13c is slightly away from the butt-joint interface BJ. When light propagates from the first multilayer 17 to the second multilayer 19, the light passes through the narrow waveguide portion WGP after passing through the butt-joint interface BJ. When light propagates from the second multilayer 19 to the first multilayer 17, the light passes through the narrow waveguide portion WGP and then through the butt-joint interface BJ.

Referring to FIGS. 1B, 2A, 2B, 2C, the waveguide mesa 15 has a lower cladding layer 25, and the lower cladding layer 25 is provided on the first region 13a, the second region 13b, and the third region 13c. The lower cladding layer 25 is shared by the first multilayer 17 and the second multilayer 19, and the first core layer 21a and the second core layer 23a are provided on the lower cladding layer 25. In this embodiment, the waveguide mesa 15 includes a diffraction grating layer 26, and the diffraction grating layer 26 is provided between the lower cladding layer 25 and the first core layer 21a and between the lower cladding layer 25 and the second core layer 23a. The diffraction grating layer 26 has a diffraction grating structure on the first region 13a at an interface between the first core layer 21a and the lower cladding layer 25. This grating structure allows distributed feedback (DFB). The diffraction grating layer 26 does not provide a diffraction grating structure on the second region 13b and the third region 13c.

The first multilayer 17 has a first upper cladding layer 27 on the first core layer 21a. The second laminate 19 has a second upper cladding layer 29 on the second core layer 23a including the core portion 23b. The core portion 23b and the second upper cladding layer 29 are provided on an end surface 27e of the first upper cladding layer 27 and on an end surface 21e of the first core layer 21a in the butt-joint interface BJ. Specifically, the core portion 23b extends along the end surface 27e of the first upper cladding layer 27 and the end surface 21e of the first core layer 21a in the butt-joint interface BJ. The core portion 23b extends along the lower cladding layer 25 at a position away from the end surface 27e of the first upper cladding layer 27.

The second core layer 23a has a thickness variation in the Ax1 direction on the lower cladding layer 25. In the third region 13c, a composition of the core portion 23b changes in the Ax1 direction. This change is larger than the scope of variation in manufacturing. This change is larger compared with the composition variation of the second core layer 23a on the second region 13b. Specifically, this compositional change applies a longer band gap wavelength to the core portion 23b than the band gap wavelength of the second core layer 23a.

The semiconductor integrated optical device 11 further includes a first electrode 37, and the first electrode 37 is connected to an upper surface 17b of the first multilayer 17 on the first region 13a. The semiconductor integrated optical device 11 further includes a second electrode 39, and the second electrode 39 is connected to an upper surface 19b of the second multilayer 19 on the second region 13b. The semiconductor integrated optical device 11 has a common electrode 38 provided on a back surface of the support 13.

In this embodiment, the first core layer 21a may include an active layer of a semiconductor light emitting device, and the second core layer 23a may include a light absorbing layer of a semiconductor modulator. Specifically, the semiconductor light emitting device may include, for example, a semiconductor laser, a semiconductor optical amplifier. The semiconductor modulator may be, for example, an electro-absorption modulator. According to the semiconductor integrated optical device 11, the electro-absorption modulator can be integrated with the semiconductor light emitting element. The semiconductor integrated optical device 11 can reduce optical loss in optical coupling between the electro-absorption modulator and the semiconductor light emitting element. The first element and the second element to be optically coupled are, however, not limited thereto.

In the first multilayer 17, the first core layer 21a may have a quantum well structure 22, and the quantum well structure 22 may perform light processing, e.g., one of generation and amplification of light, in response to electrical application to the first electrode 37.

In the second multilayer 19, the second core layer 23a may have a quantum well structure 24, and the quantum well structure 24 may perform light processing, e.g., modulation, in response to an electrical application to the second electrode 39.

In this embodiment, quantum well structure 22 includes one or more well layers 22a and a plurality of barrier layers 22b provided to enable light emission. The quantum well structure 24 includes one or more well layers 24a and a plurality of barrier layers 24b provided to enable light modulation.

The quantum well structure 22 exhibits a first bandgap wavelength on the first region 13a. The quantum well structure 24 exhibits a second bandgap wavelength on the second region 13b. In the present embodiment, the second bandgap wavelength is smaller than the first bandgap wavelength by about 60 nm, for example. In the third region 13c, the variation of the thickness of the core portion 23b of the waveguide portion WGP accompanies with the variation of the composition of the waveguide portion WGP. The core portion 23b exhibits a third bandgap wavelength greater than the second bandgap wavelength, and the third bandgap wavelength may be less than the first bandgap wavelength.

In a specific light propagation, light propagating from the first multilayer 17 to the second multilayer 19 passes through the narrow waveguide portion WGP having the long bandgap wavelength after passing through the butt-joint interface BJ. Light propagating from the second multilayer 19 to the first stack 17 passes through the narrow waveguide portion WGP having the long bandgap wavelength before passing through the butt joint interface BJ. The narrow waveguide portion WGP allows the light propagating through the waveguide portion WGP to spread to the buried semiconductor region 41 provided on the side surface of the waveguide portion WGP. The waveguide portion WGP having a narrow waveguide width for spreading the propagating light can reduce the light absorption loss due to the long band gap wavelength in the core portion 23b.

The waveguide mesa 15 has a third upper cladding layer 31 on the first region 13a, the second region 13b, and the third region 13c. The third upper cladding layer 31 is shared by the first multilayer 17 and the second multilayer 19.

According to the semiconductor integrated optical device 11, the third upper cladding layer 31 extends from an upper surface 27a of the first upper cladding layer 27 and an upper surface 29a of the second upper cladding layer 29, and is shared by the first element and the second element. The first core layer 21a and the second core layer 23a are arranged in series along the axis Ax1 between the lower cladding layer 25 and the third upper cladding layer 31.

The waveguide mesa 15 has the lower cladding layer 25 and the third upper cladding layer 31. The butt joint interface BJ, the first core layer 21a, and the second core layer 23a are provided between the lower cladding layer 25 and the third upper cladding layer 31.

As described above, the first multilayer 17 has the first mesa width MS1W on the first region 13a. The second multilayer 19 has the second mesa width MS2W on the second region 13b. As a result, the lower cladding layer 25 of the second multilayer 19 and the third upper cladding layer 31 have the third mesa-width MS3W in the waveguide portion WGP on the third region 13c.

Referring to FIG. 1A, the waveguide mesa 15 has a first tapered portion 20a and a second tapered portion 20b in the waveguide portion WGP. The first tapered portion 20a and the second tapered portion 20b are arranged in the direction of the axis Ax1 from the first region 13a to the second region 13b. In the present embodiment, the first tapered portion 20a and the second tapered portion 20b are provided to the second multilayer layer 19 on the third region 13c.

In the present embodiment, the waveguide portion WGP may have a narrow mesa portion 20c between the first tapered portion 20a and the second tapered portion 20b, and the narrow mesa portion 20c has the third mesa width MS3W. If necessary, the first tapered portion 20a and the second tapered portion 20b may be connected to each other without the narrow mesa portion 20c. The third mesa width MS3W is provided at a connecting point between the first tapered portion 20a and the second tapered portion 20b.

Specifically, the first tapered portion 20a has the first mesa width MS1W at one end 20d of the first tapered portion 20a and the third mesa width NS3W at the other end 20e of the first tapered portion 20a. More specifically, the mesa width of the first tapered portion 20a decreases from the one end 20d to the other end 20e, and the first mesa width MS1W is larger than the third mesa width NS3W.

Specifically, the second tapered portion 20b has the second mesa width MS2W at one end 20f of the second tapered portion 20b and has the third mesa width MS3W at the other end 20g of the second tapered portion 20b. More specifically, the mesa width of the second tapered portion 20b decreases from the one end 20f to the other end 20g, and the second mesa width MS2W is larger than the third mesa width NS3W.

According to the semiconductor integrated optical device 11, the first tapered portion 20a and the second tapered portion 20b are provided to the second multilayer layer 19. The change in the mesa width of the first tapered portion 20a is, for example, monotonous in the direction from the first region 13a to the third region 13c on the third region 13c. The change in the mesa width of the second tapered portion 20b is, for example, monotonous in the direction from the second region 13b to the third region 13c on the third region 13c.

The first tapered portion 20a may have a length of 20 to 40 micrometers, and the second tapered portion 20b may have a length of 20 to 40 micrometers. The narrow mesa portion 20c may have a length of 30 to 50 micrometers. The third region 13c may have a length of 30 to 50 micrometers.

The other end 20e of the first tapered portion 20a, the one end 20f of the second tapered portion 20b, and the other end 20g of the second tapered portion 20b are away from the butt-joint interface BJ. The narrow mesa portion 20c is away from the butt-joint interface BJ.

In this embodiment, the one end 20d of the first tapered portion 20a is located at the boundary between the first region 13a and the third region 13c, and is connected to the first multilayer 17 on the first region 13a at this boundary. The one end 20f of the second tapered portion 20b is located at the boundary between the second region 13b and the third region 13c, and is connected to the second multilayer 19 on the second region 13b at this boundary.

Referring to FIGS. 2A to 2C, the buried semiconductor region 41 covers side surfaces 15a and 15b of the waveguide mesa 15 on the first region 13a and the third region 13c. In this embodiment, the buried semiconductor region 41 further covers the side surfaces 15a and 15b of the waveguide mesa 15 even on the second region 13b. The buried semiconductor region 41 includes a first semiconductor portion 41a, a second semiconductor portion 41b, and a third semiconductor portion 41c. The first semiconductor portion 41a, the second semiconductor portion 41b, and the third semiconductor portion 41c are provided on the first region 13a, the second region 13b, and the third region 13c, respectively.

The first semiconductor portion 41a covers both side surfaces 17a of the first multilayer 17 on the first region 13a. The second semiconductor portion 41b embeds both side surfaces 19a of the second multilayer 19 on the second region 13b. The thickness (T2) of the second semiconductor portion 41b at the one side surface 19a may be 0.2 to 0.4 micrometers. The third semiconductor portion 41c buries both side surfaces 15a and 15b of the waveguide mesa 15 on the third region 13c. The third semiconductor portion 41c has a thickness (T3) larger than the thickness (T2) of the second semiconductor portion 41b. The first semiconductor portion 41a may have a thickness T1 greater than the thickness of the third semiconductor portion 41c.

The first semiconductor portion 41a, the second semiconductor portion 41b, and the third semiconductor portion 41c each has a first thickness T1, a second thickness T2, and a third thickness T3 on each of the side surfaces 15a, 15b of both the waveguide mesas 15. Each of the first thickness T1, the second thickness T2, and the third thickness T3 may be defined by half of a distance between the first side surface 41d of the buried semiconductor region 41 and the side surface 15b of the waveguide mesa 15. Alternatively, the first thickness T1, the second thickness T2, and the third thickness T3 may be defined by a distance between a second side surface 41e of the buried semiconductor region 41 and the side surface 15a of the waveguide mesa 15. The third thickness T3 is greater than the second thickness T2 and is between the first thickness T1 and the second thickness T2.

According to the semiconductor integrated optical device 11, light propagating through the waveguide portion WGP on the third region 13c can be spread into the third semiconductor portion 41c.

Referring to FIGS. 1A and 2B, the third semiconductor portion 41c may have a tapered portion of the buried semiconductor region 41. Specifically, in the tapered portion, a distance between the first and the second side surfaces 41a, 41b of the buried semiconductor region 41 increases in the direction from the second semiconductor portion 41b to the first semiconductor portion 41a.

Referring to FIGS. 2A to 2c, the semiconductor integrated optical device 11 may include a first inorganic insulating layer 43 provided on the waveguide mesa 15 and the buried semiconductor region 41. The semiconductor integrated optical device 11 may include a resin body 45 embedding the waveguide mesa 15 and the buried semiconductor region 41 on the second region 13b and the third region 13c. The buried semiconductor region 41 may separate the resin body 45 from the waveguide mesa 15 on the third region 13c.

The semiconductor integrated optical device 11 may include a second inorganic insulating layer 47 provided on the buried semiconductor region 41 and the resin body 45. In this embodiment, the first electrode 37 and the second electrode 39 are connected to the upper surface of the waveguide mesa 15 through openings (OP1, OP2) of the first inorganic insulating layer 43 and the second inorganic insulating layer 47.

Examples of semiconductor integrated optical devices 11.
Support 13: n-type InP wafer.
The waveguide mesa 15 includes;
Lower cladding layer 25: n-type InP,
Diffraction grating layer 26: n-type InGaAs,
Third upper cladding layer 31: p-type InP, and
Contact layer 32: p-type InGaAs.
The first multilayer 17 includes;
Quantum-well structure 22 of the first core layer 21a (well layer 22a/barrier layer 22b): GaInAsP/GaInAsP,
First bandgap wavelength: 1.55 micrometers, and
First upper cladding layer 27: p-type InP, film thickness 1 to 3 micrometers.
The second multilayer 19 includes;
Quantum-well structures 24 of the second core layer 23a (well layer 24a/barrier layer 24b): GaInAsP/GaInAsP,
Second bandgap wavelength: 1.49 micrometers, and
Second upper cladding layer 29: p-type InP, film thickness 1 to 3 micrometers.
Buried semiconductor region 41: Fe-doped InP.
First inorganic insulating layer 43: $SiO_2$.
Resin body 45: Benzocyclobutene (BCB) resin.
Second inorganic insulating layer 47: $SiO_2$.

A method of fabricating the semiconductor integrated optical device according to the present embodiment will be described with reference to FIGS. 3A to 13B. In the following description, where possible, the reference numerals used in the description made with reference to FIGS. 1A to 2C are used.

Figure 11A:
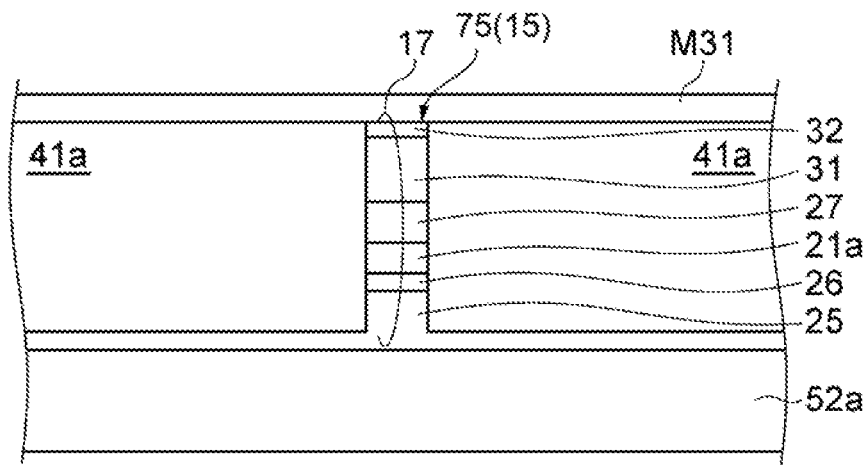
FIG. 11A is a view showing a cross section in the first region.
Figure 11B:
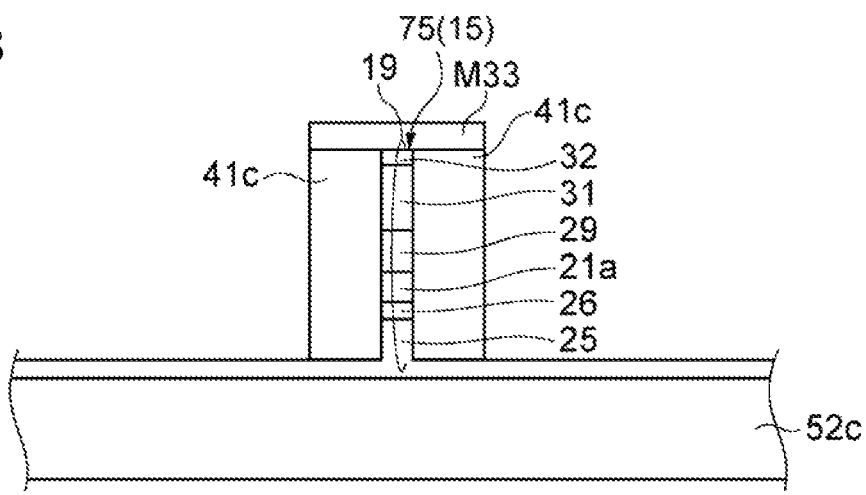
FIG. 11B is a view showing a cross section in the third region.
Figure 11C:
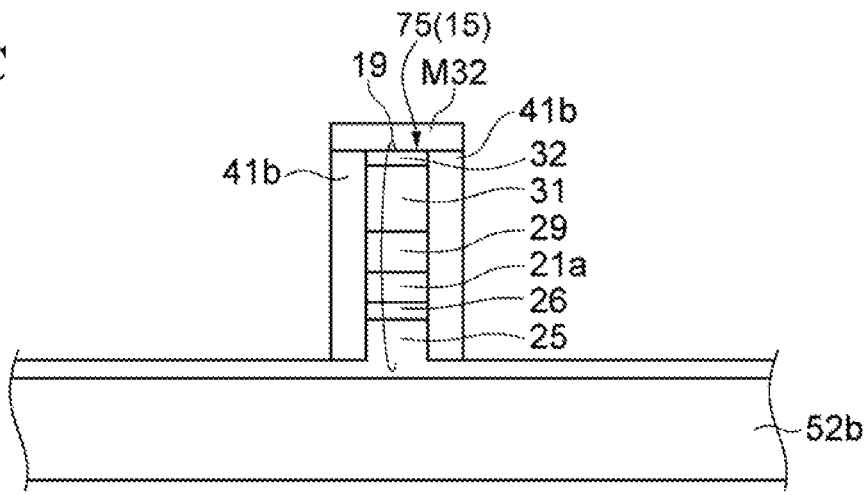
FIG. 11C is a view showing a cross section in the second region.
Figure 12A:
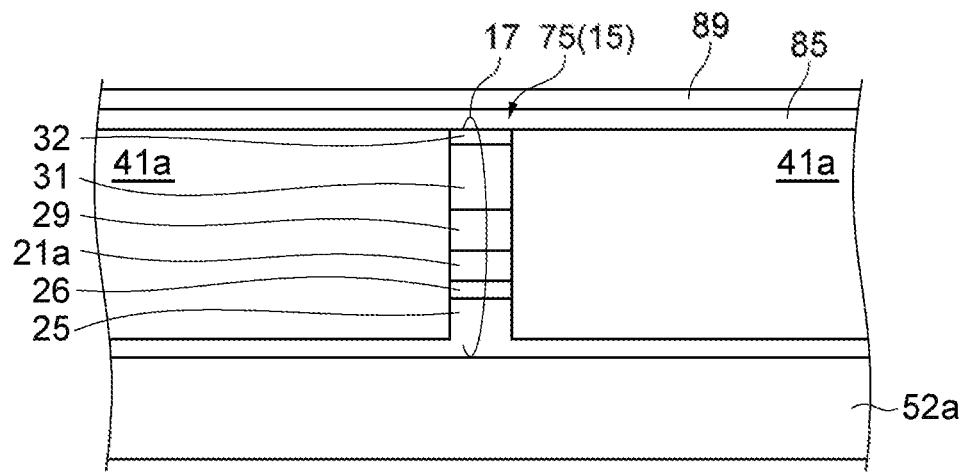
FIG. 12A is a view showing a cross section in the first region.
Figure 12B:
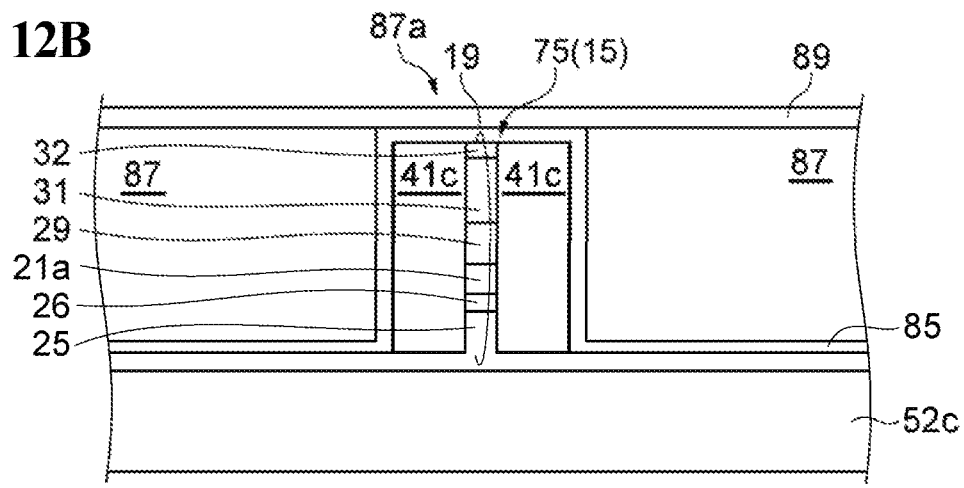
FIG. 12B is a view showing a cross section in the third region.
Figure 12C:
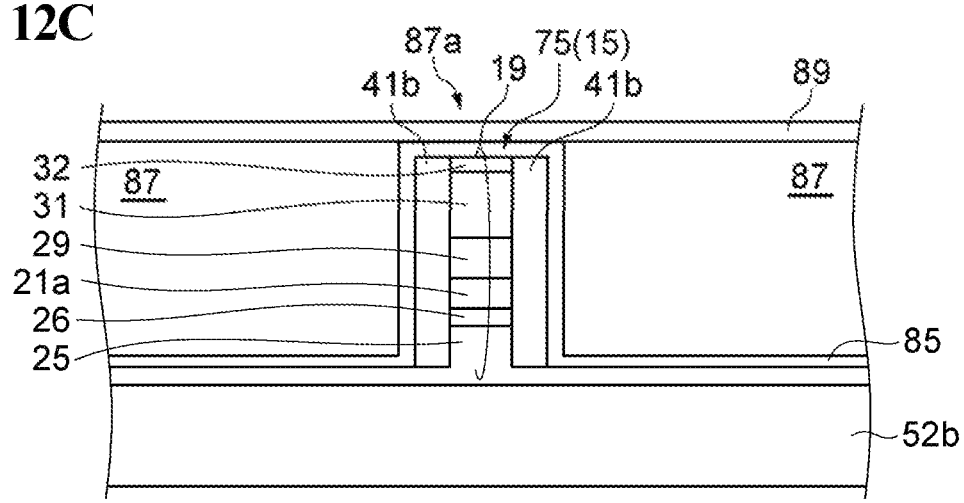
FIG. 12C is a view showing a cross section in the second region.

FIGS. 3A to 7A, FIG. 9A, FIG. 10A and FIG. 13A are plan views showing main steps in a method for fabricating the semiconductor integrated optical device according to the present embodiment. FIGS. 3B to 7B, FIG. 9B, FIG. 10B and FIG. 13B are diagrams showing cross-sections taken along an axis Ax1 in FIGS. 3A to 7A, FIG. 9A, FIG. 10A and FIG. 13A, respectively. FIG. 8A, FIG. 8B and FIG. 8C are diagrams showing cross-sections taken along the VIIIa-VIIIa line, the VIIIb-VIIIb line and the VIIIc-VIIIc line shown in FIG. 7A, respectively. FIGS. 11A, 11B, and 11C are diagrams showing cross-sections in the first region, the third region, and the second region, respectively, in the main process according to the present embodiment. FIGS. 12A, 12B, and 12C are diagrams showing cross-sections in the first region, the third region, and the second region, respectively, in the main process according to the present embodiment.

Referring to FIGS. 3A to 6B, processes for preparing an epitaxial substrate EP for a semiconductor integrated optical device 11 that monolithically integrates a first element and a second element will be described. The crystal growth of semiconductor layers is performed by, for example, metal organic vapor phase epitaxy (MOVPE) and/or molecular beam epitaxy (MBE).

Figure 3A:
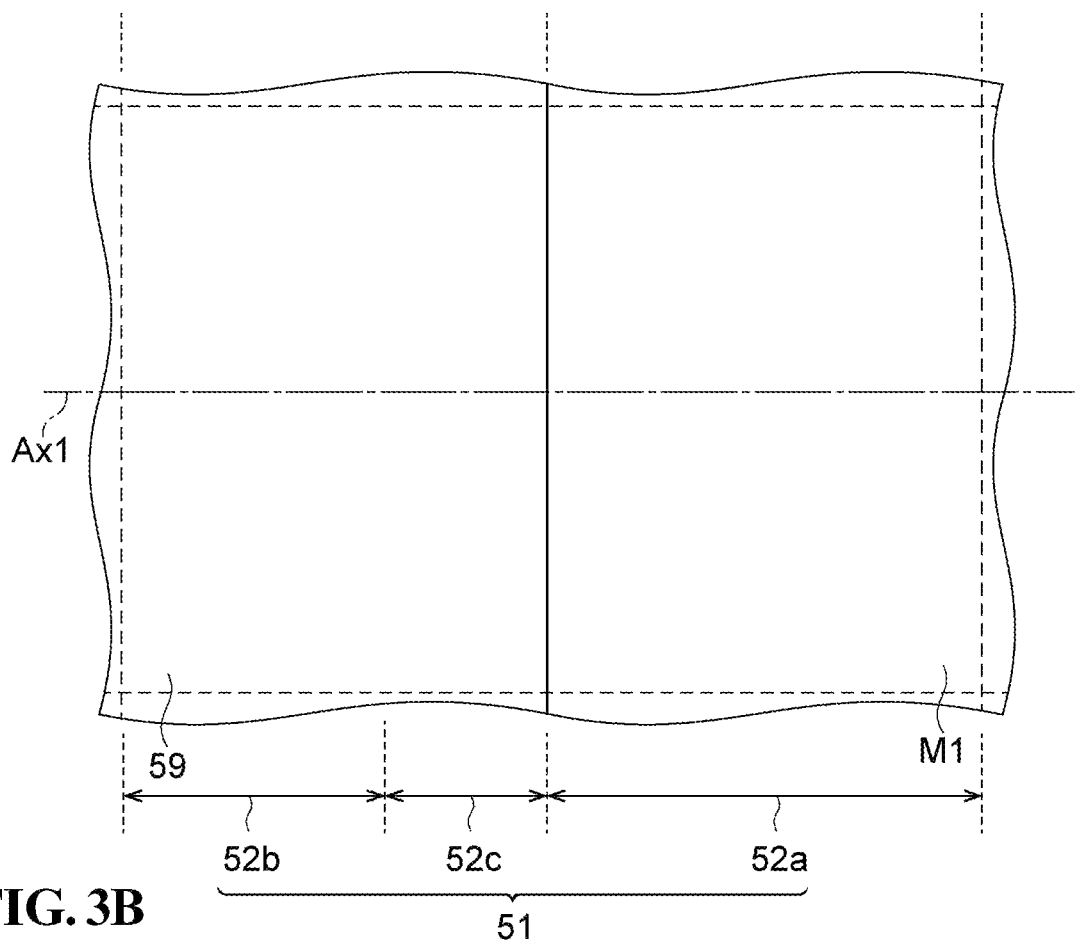
FIG. 3A is a plan view showing a main step in the process of fabricating the semiconductor integrated optical device according to the present embodiment.
Figure 3B:
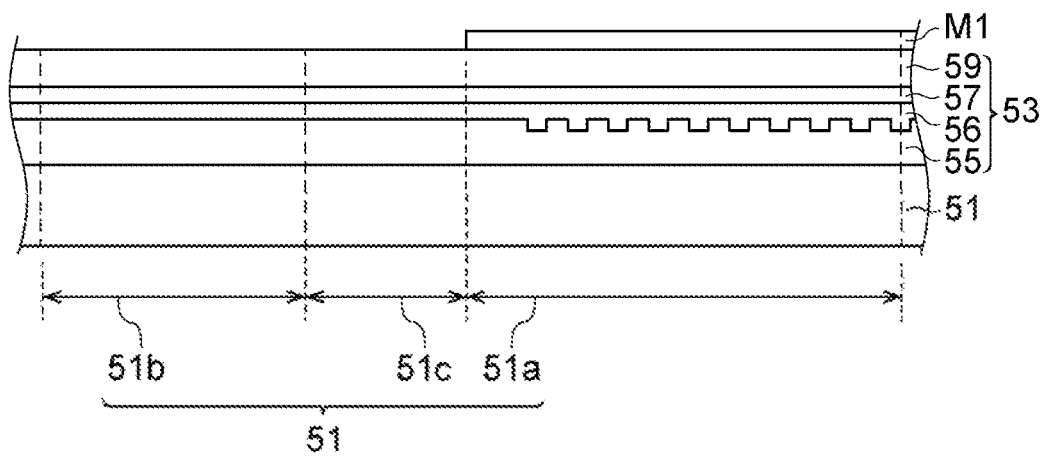
FIG. 3B is a diagram showing a cross section taken along the waveguide axis in FIG. 3A.

Referring to FIGS. 3A and 3B, a substrate 51 is prepared and a semiconductor laminate is grown on the substrate 51. A lower laminate 53 is grown on a first area 51a, second area 51b, and a third area 51c of the substrate 51. The first area 51a, the third area 51c, and the second area 51b are arranged in a direction of the axis Ax1. In a later process, a butt-joint interface BJ will be formed at the border between the third area 51c and the second area 51b. The first to third areas 51a to 51c correspond to the first to the third regions 13a to 13c (the first to the third regions 52a to 52c) of the support 13, respectively. The lower laminate 53 includes a lower semiconductor film 55 for the lower cladding layer 25 shared by the first element and the second element, a first semiconductor film 57 for the first core layer 21a of the first element, and an upper semiconductor film 59 for the first upper cladding layer 27 of the first element. If necessary, the lower laminate 53 may include a semiconductor film 56 for the diffraction grating layer 26 between the lower semiconductor film 55 and the first semiconductor film 57. In the semiconductor film 56, a diffraction grating structure allowing distributed feedback (DFB) may be formed by photolithography and etching prior to the growth of the first semiconductor film 57. The diffraction grating structure is selectively formed on the first area 51a.

After the lower laminate 53 is grown, a mask M1 of an insulator is formed on the lower laminate 53 by chemical vapor deposition (CVD), photolithography, and etching. The mask M1 has a pattern covering the first area 51a and including an opening from the second area 51b to the third area 51c. The mask M1 may include a silicon-based inorganic insulator such as SiN, for example.

Figure 4A:
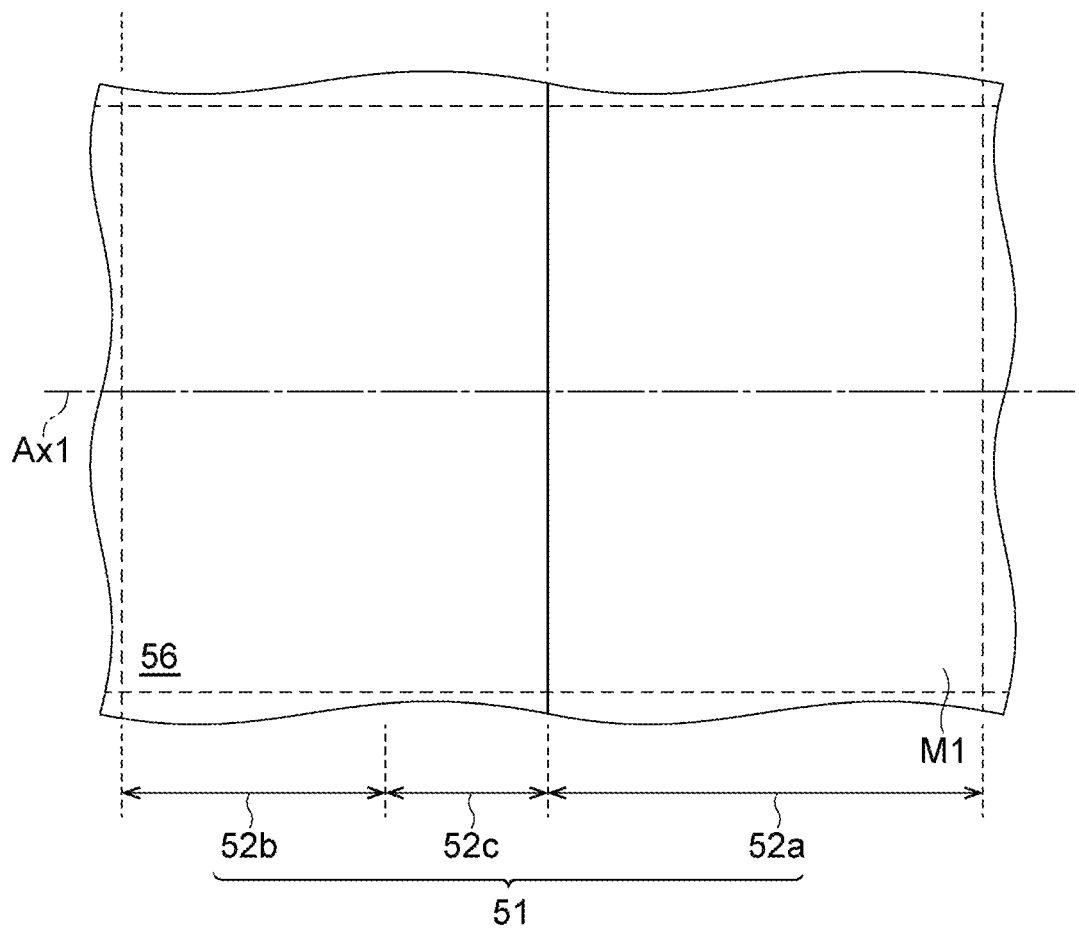
FIG. 4A is a plan view showing a main step in the process of fabricating the semiconductor integrated optical device according to the present embodiment.
Figure 4B:
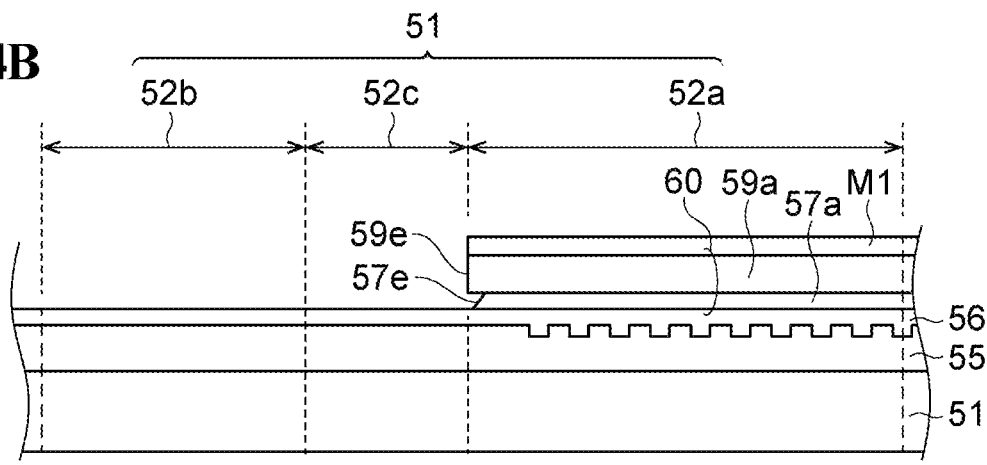
FIG. 4B is a diagram showing a cross section taken along the waveguide axis in FIG. 4A.

Referring to FIGS. 4A and 4B, the semiconductor films 59 and 57 of the lower laminate 53 are etched using the mask M1, and a butt-joint mesa 60 including a first core semiconductor film 57a and a first cladding semiconductor film 59a is formed on the first area 51a. The first core semiconductor film 57a and the first cladding semiconductor film 59a are formed from the first semiconductor film 57 and the upper semiconductor film 59, respectively. The etching includes dry etching and wet etching. In dry etching, $CH_4/H_2$ gases are used as etchants, and in wet etching, sulfuric acid-based solutions are used as etchants. The butt-joint mesa 60 has an end surface 57e of the first core semiconductor film 57a and an end surface 59e of the first cladding semiconductor film 59a formed by etching. In this embodiment, in the second area 51b and the third area 51c, the semiconductor film 56 is hardly etched. The lower semiconductor film 55 and the semiconductor film 56 are left without being etched. The first cladding semiconductor film 59a protrudes like an eave from the end surface 57e of the first core semiconductor film 57a. The end surface 57e and the end surface 59e form a step in the butt-joint mesa 60.

Figure 5A:
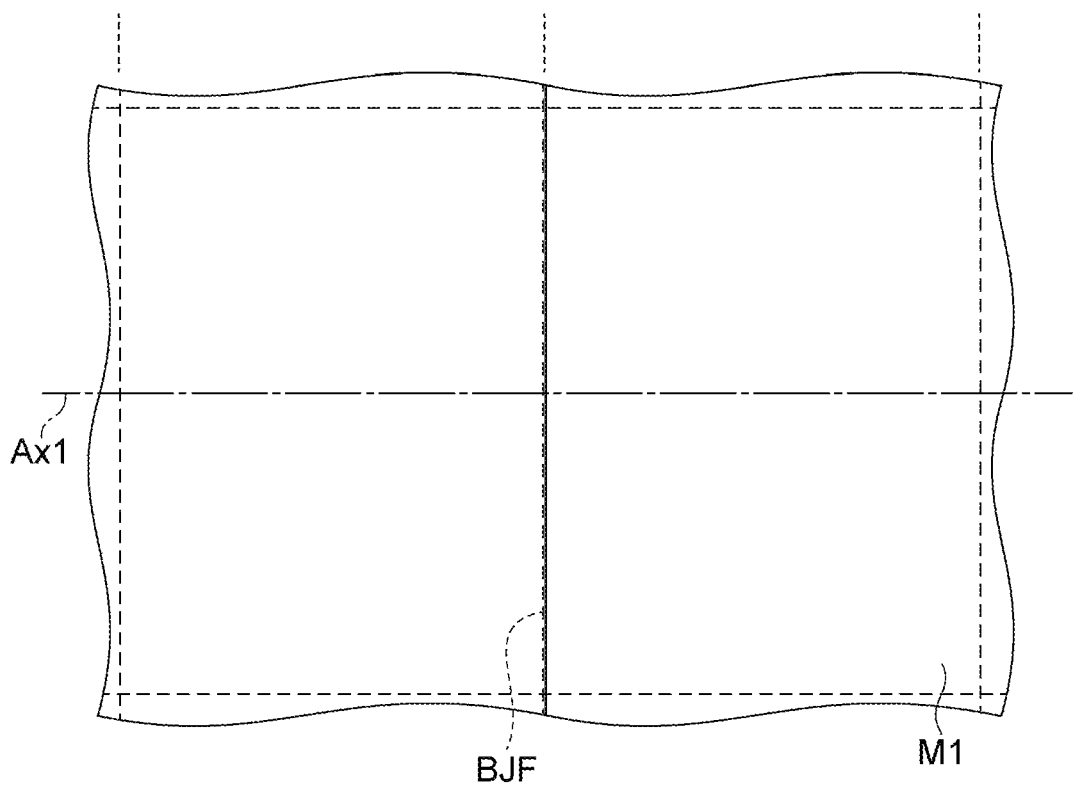
FIG. 5A is a plan view showing a main step in the process of fabricating the semiconductor integrated optical device according to the present embodiment.
Figure 5B:
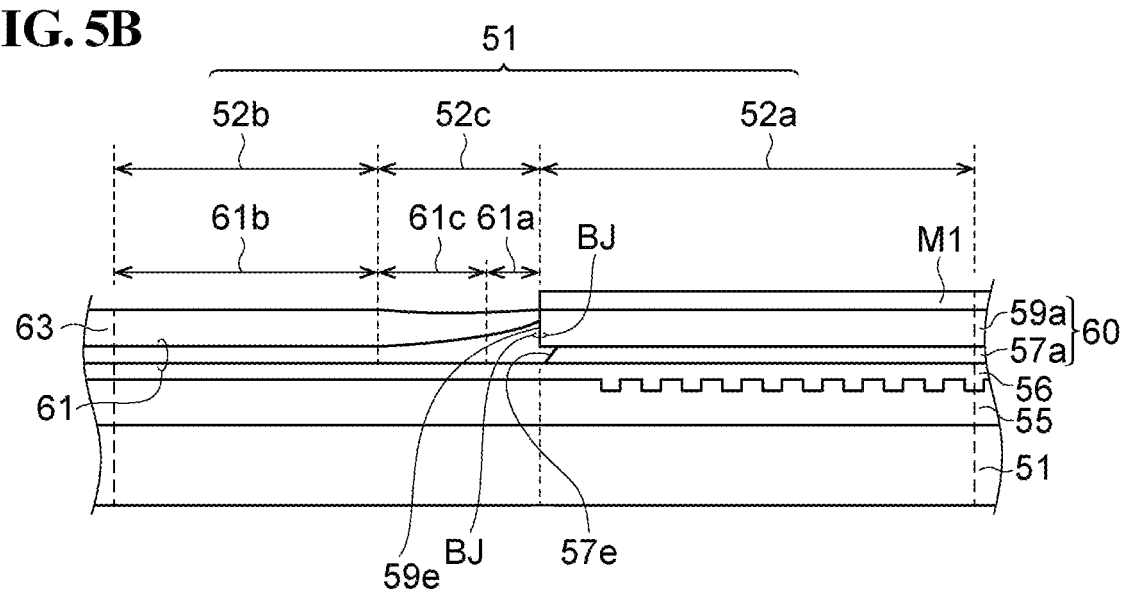
FIG. 5B is a diagram showing a cross section taken along the waveguide axis in FIG. 5A.

Referring to FIG. 5A and FIG. 5B, after this etch, an upper laminate is selectively grown using the mask M1 on the second and the third regions 52b, 52c. The upper laminate includes a second core semiconductor film 61 and a second cladding semiconductor film 63. The second core semiconductor film 61 is for the second core layer 23a including the core portion 23b of the second element. The second cladding semiconductor film 63 is for the second upper cladding layer 29. In the third region 52c, the second semiconductor film 61 is selectively grown on the end surface 57e and on the end surface 59e through the opening of the mask M1. Thus, the butt-joint interface BJ is formed between the first area 51a and the third area 51b. Because of the existence of the mask M1 in the vicinity of the third area 51c during the selective growth, thickness variation of the second core semiconductor film 61 is provided in the third area 51c. After this growth, the mask M1 is removed.

The second core semiconductor film 61 has a first portion 61a, a second portion 61b, and a third portion 61c, and the third portion 61c extends from the first portion 61a to the second portion 61b over the third region 52c. When the second core semiconductor film 61 is selectively grown, the first portion 61a, the second portion 61b, and the third portion 61c are grown on the end surface 57e, on the second region 52b, and on the third region 52c, respectively. By using the mask M1 in the selective growth, the second portion 61b has a film thickness different from the film thickness of the third portion 61c.

In addition, the first portion 61a and the third portion 61c have a composition different from the composition of the second portion 61b due to the existence of the mask M1.

According to a method of fabricating the semiconductor integrated optical device, a change in film thickness and composition in the third portion 61c away from the first portion 61a causes a loss in light propagating through the waveguide mesa 15 on the third region 13c. The change in composition shifts the band gap wavelength of the third portion 61c to a longer wavelength than the band gap wavelength of the second portion 61b. Absorption loss increases when the band gap wavelength shifts to a longer wavelength.

Figure 6A:
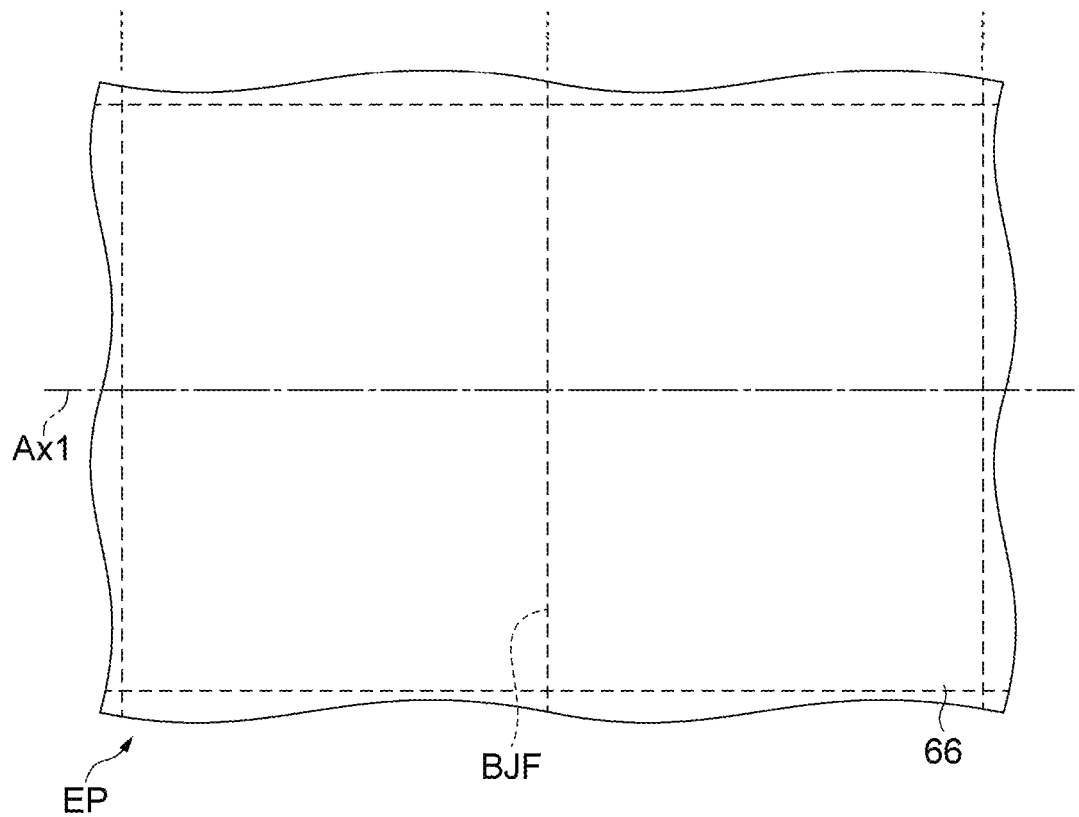
FIG. 6A is a plan view showing a main step in the process of fabricating the semiconductor integrated optical device according to the present embodiment.
Figure 6B:
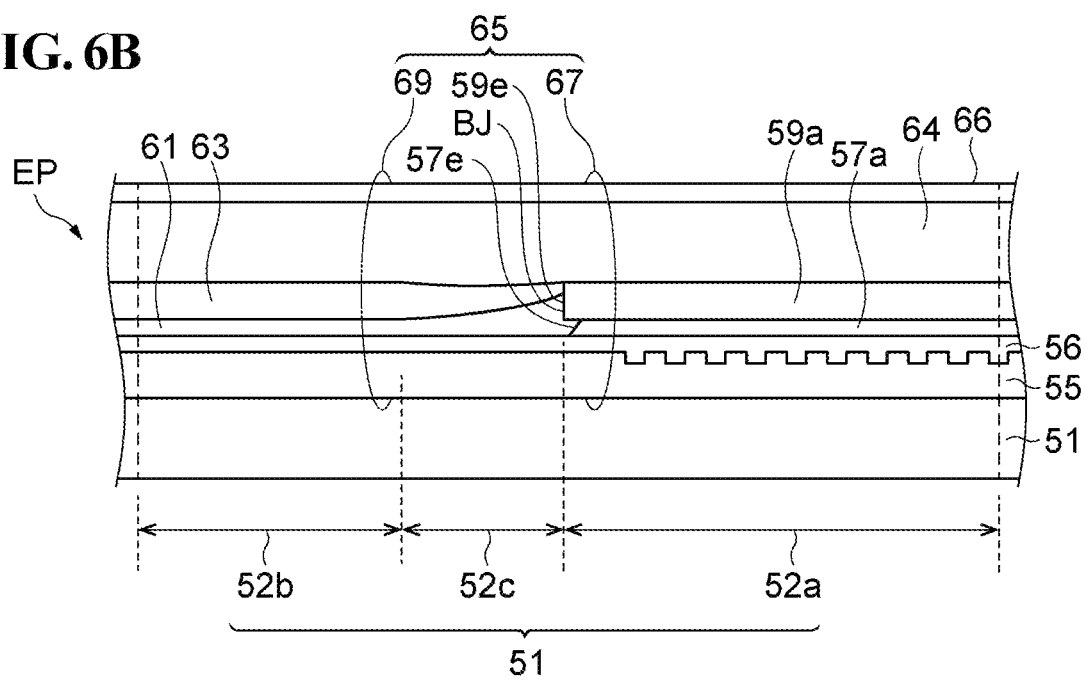
FIG. 6B is a diagram showing a cross section taken along the waveguide axis in FIG. 6A.

Referring to FIGS. 6A and 6B, after the mask M1 is removed, a third cladding semiconductor film 64 and a contact film 66 are grown on the first cladding semiconductor film 59a, the second cladding semiconductor film 63, and the butt-joint interface BJ.

Through these processes, the epitaxial substrate EP is manufactured. As a result of this fabrication, the epitaxial substrate EP is provided with the substrate 51 and a semiconductor epi region 65. The semiconductor epi region 65 includes a first semiconductor multilayer 67 for the first element, a second semiconductor multilayer 69 for the second element, and the butt-joint interface BJ. The first semiconductor multilayer 67 and the second semiconductor multilayer 69 are provided on the first region 52a, the second region 52b, and the third region 52c.

Figure 7A:
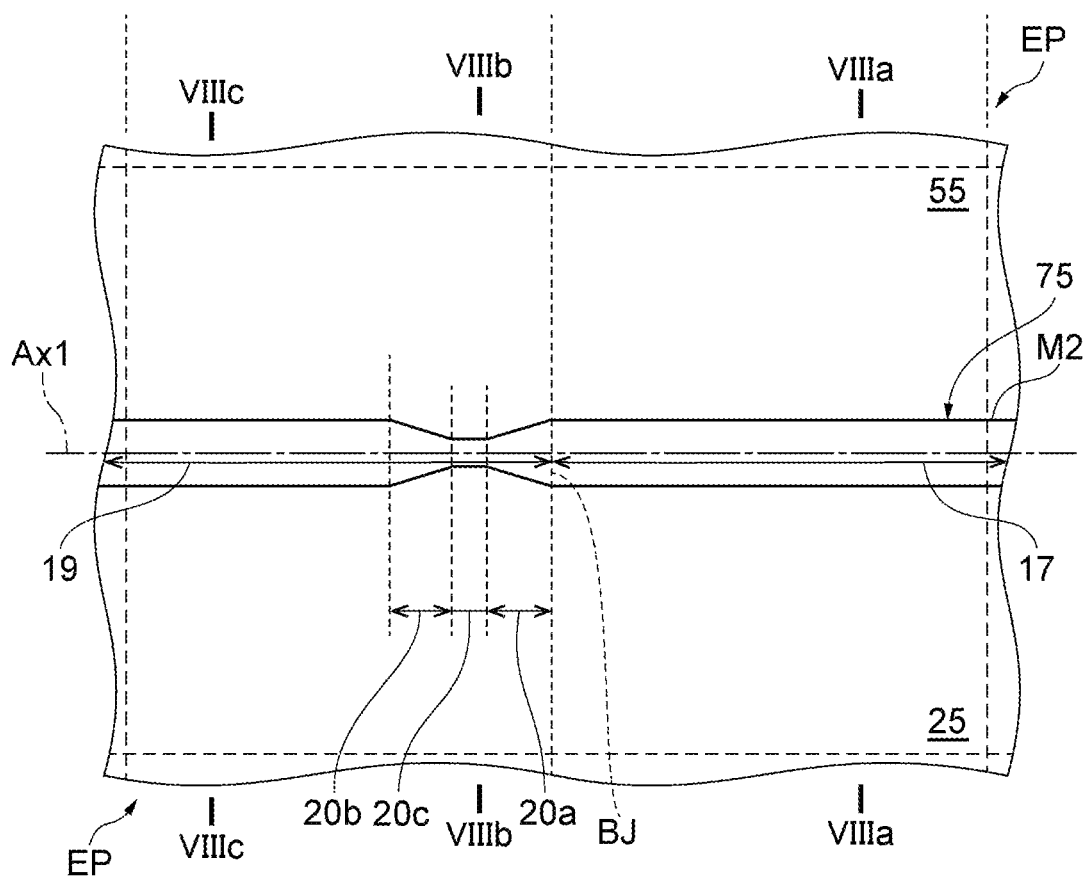
FIG. 7A is a plan view showing a main step in the process of fabricating the semiconductor integrated optical device according to the present embodiment.
Figure 7B:
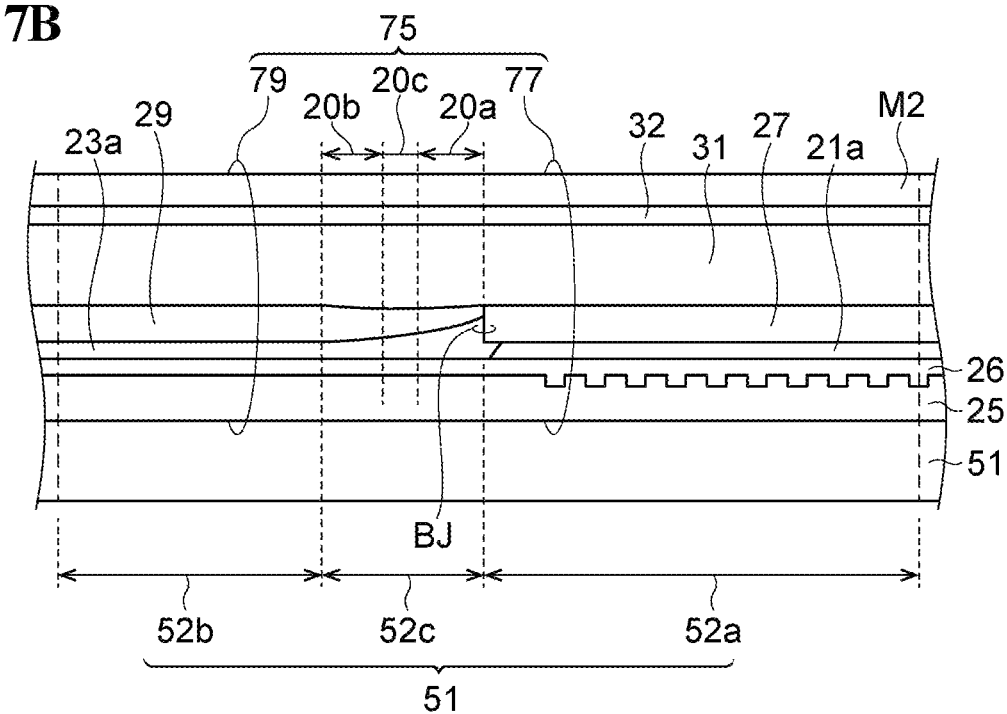
FIG. 7B is a diagram showing a cross section taken along the waveguide axis in FIG. 7A.
Figure 8A:
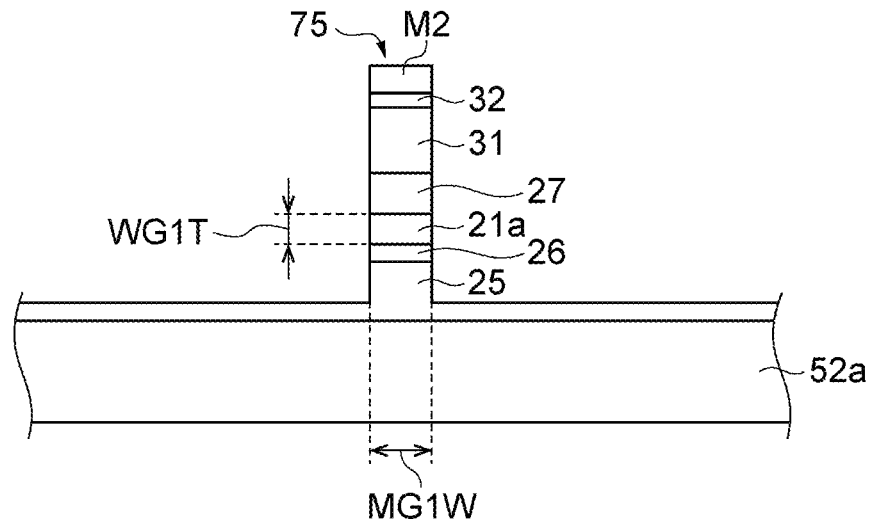
FIG. 8A is a diagram showing a cross-section taken along the VIIIa-VIIIa line shown in FIG. 7A.
Figure 8B:
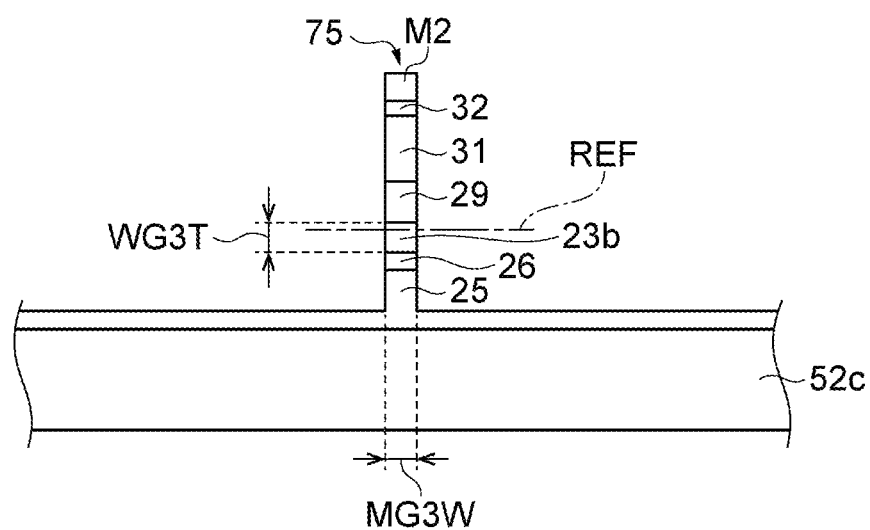
FIG. 8B is a diagram showing a cross-section taken along the VIIIb-VIIIb line shown in FIG. 7A.
Figure 8C:
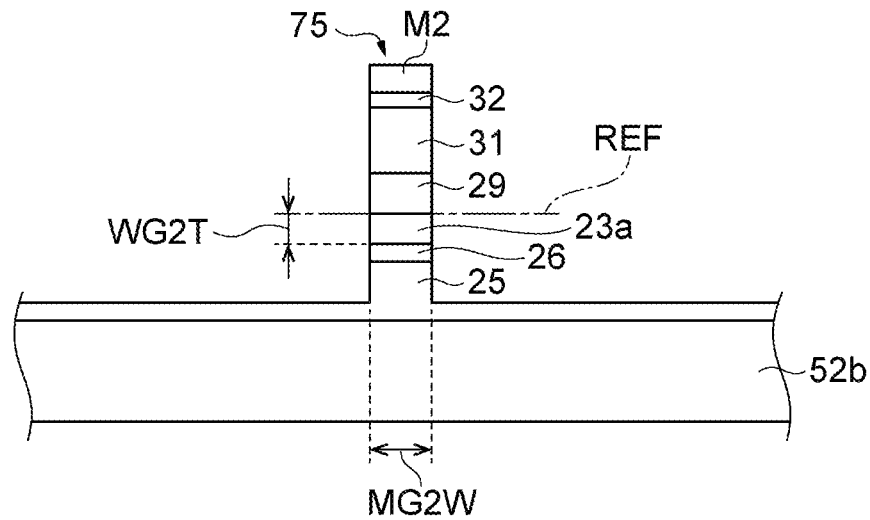
FIG. 8C is a diagram showing a cross-section taken along the VIIIc-VIIIc line shown in FIG. 7A.

Referring to FIGS. 7A and 7B, a waveguide mask M2 is foil led on the epitaxial substrates EP. The waveguide mask M2 has a waveguide pattern extending across the butt-joint interface BJ. The waveguide mask M2 may include a silicon-based inorganic insulator such as SiN. The epitaxial substrate EP is etched using the waveguide mask M2 to form a waveguide mesa 75. The etching includes dry etching.

The first multilayer 77 and the second multilayer 79 of the waveguide mesa 75 are fabricated from the first semiconductor multilayer 67 and the second semiconductor multilayer 69, respectively. The first multilayer 77 extends from the butt-joint interface BJ to the first region 52a, and the second multilayer 79 extends from the butt-joint interface BJ to the second region 52b.

According to the method of fabricating the semiconductor integrated optical device 11, in the selective growth of the second core semiconductor film 61, the second core semiconductor film 61 is grown so that the third portion 61c of the second core semiconductor film 61 has a film thickness different from the film thickness of the second portion 61b. The change in film thickness in the third portion 61c causes a loss in the light propagating through the waveguide mesa 75(15) on the third area 51c (third region 13c).

Referring to FIGS. 7A to 8C, the waveguide mesas 75 are shaped to provide the waveguide portion WGP on the third area 51c. Specifically, the waveguide portion WGP of the waveguide mesa 75 includes a first tapered portion 20a, a narrow mesa portion 20c, and a second tapered portion 20b of the waveguide mesa 15.

The waveguide portion WGP of the third mesa width MS3W smaller than the first mesa width MS1W and the second mesa width MS2W is provided to the second multilayer 79 of the waveguide mesa 75 on the third region 52c. As a result of the small third mesa width MS3W, a mode field diameter of light in the waveguide mesa 75 on the third region 52c is larger than a mode field diameter in the waveguide mesa 75 on the first and second regions 52a, 52b.

In the waveguide mesa 75, the first multilayer 77 and the second multilayer 79 have the first mesa width MS1W and the second mesa width MS2W on the first region 52a and the second region 52b, respectively. On the third region 52c, the second multilayer layer 79 has the waveguide portion WGP having the third mesa width MS3W smaller than the first mesa width MS1W and the second mesa width MW2W.

Figure 9A:
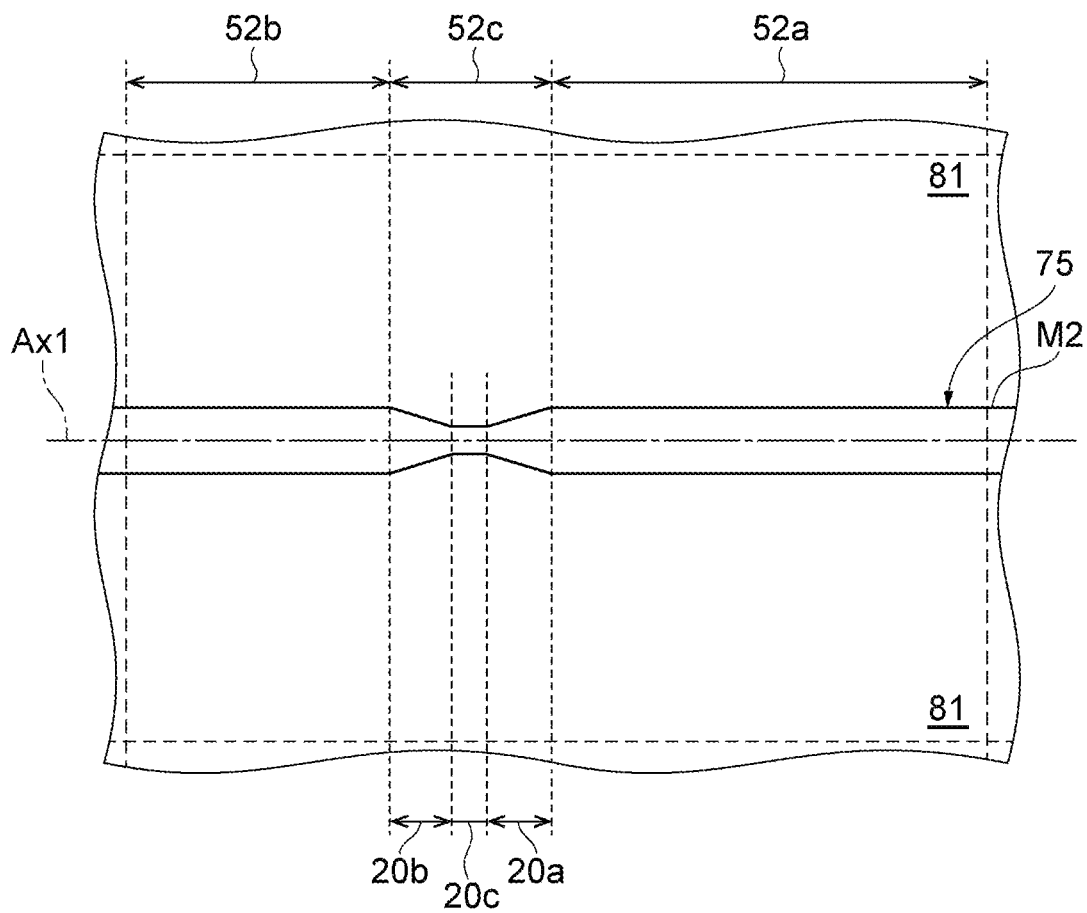
FIG. 9A is a plan view showing a main step in the process of fabricating the semiconductor integrated optical device according to the present embodiment.
Figure 9B:
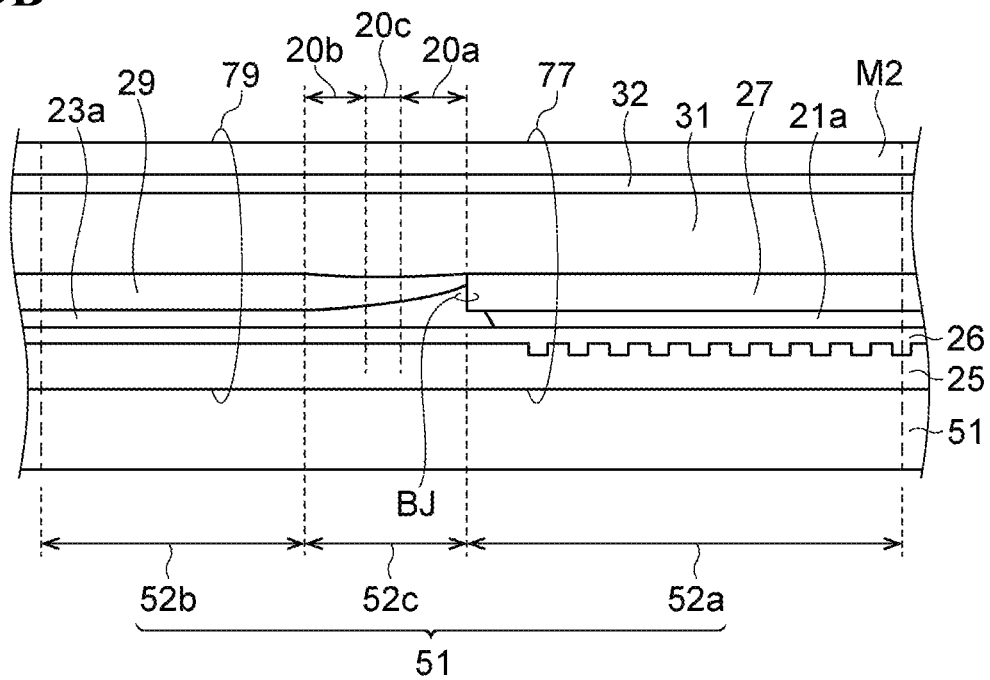
FIG. 9B is a diagram showing a cross section taken along the waveguide axis in FIG. 9A.

Referring to FIGS. 9A and 9B, a buried region 81 for embedding the waveguide mesas 75 is selectively grown on the first to third regions 52a to 52c, while leaving the waveguide masks M2 on the waveguide mesa 75. After the selective growth, the waveguide mask M2 is removed. The buried region 81 includes a high-resistivity semiconductor, e.g. a semi-insulating semiconductor. After the buried region 81 is selectively grown, the waveguide mask M2 is removed.

Figure 10A:
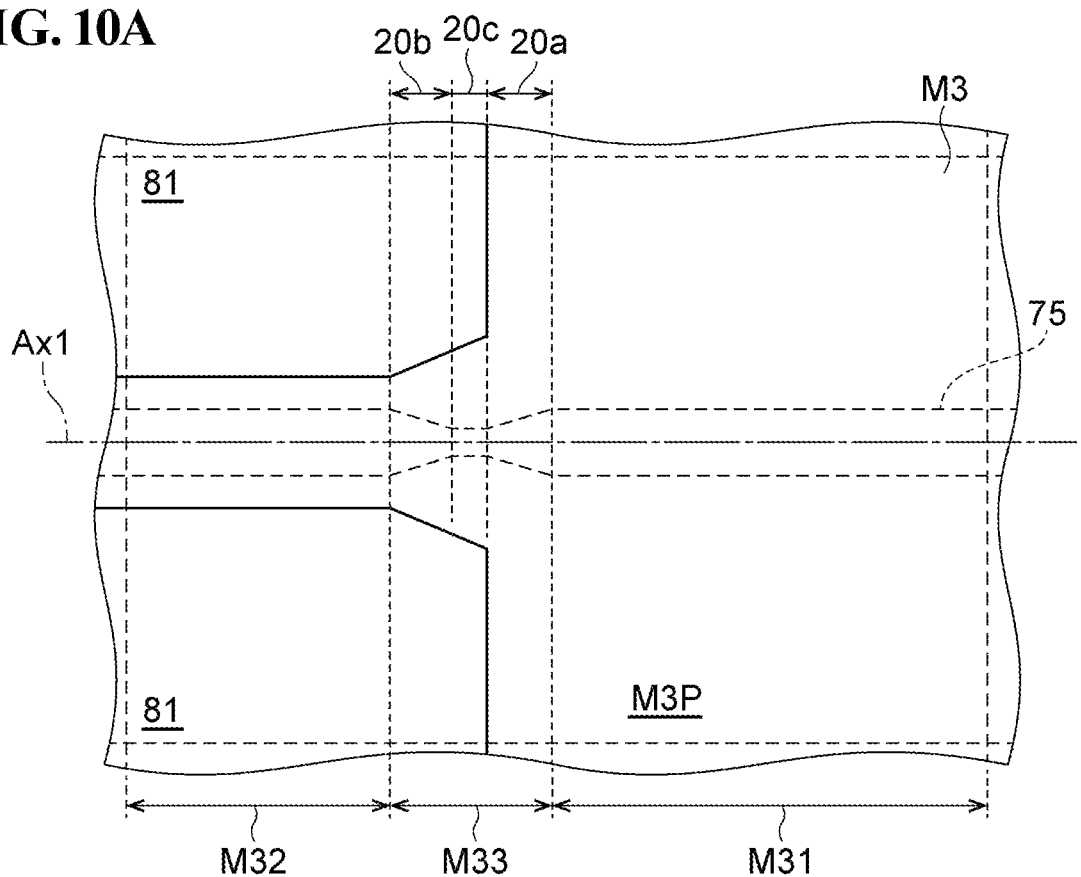
FIG. 10A is a plan view showing a main step in a method of fabricating the semiconductor integrated optical device according to the present embodiment.
Figure 10B:
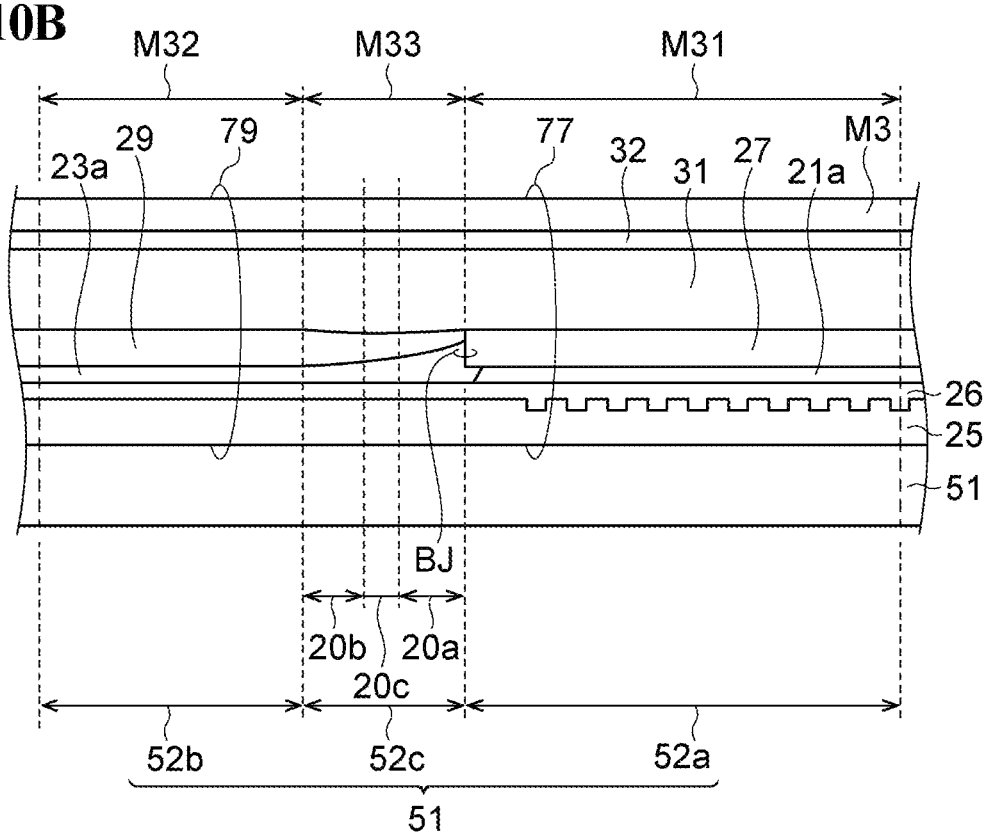
FIG. 10B shows a cross-section taken along the waveguide axis in FIG. 10A.

Referring to FIGS. 10A and 10B, a mask M3 is formed on the waveguide mesa 75 and on the buried region 81. The mask M3 includes, for example, $SiO_2$. The mask M3 has a pattern M3P including a first portion M31, a second portion M32, and a third portion M33. The first portion M31 is wider than the second portion M32, and has a vertical band shape. The first portion M31 covers the first region 52a, the butt-joint interface BJ, and a part of the third region 52c. The second portion M32 has a lateral band shape with a width of 1.2 to 2.5 micrometers so as to leave the buried region 81 with a thickness of about 0.2 to 0.5 micrometers on the both side surfaces of the second multilayer 79 and to provide the second multilayer 79 on the second region 52b with the second semiconductor portion 41b of the buried semiconductor region 41. The third portion M33 has a width that increases in the direction from the second region 52b to the first region 52a so as to connect the narrow second portion M32 to the wide first portion M31.

Referring to FIGS. 11A, 11B, and 11C, the buried region 81 is etched using the mask M3 to form a buried semiconductor region 41(41a, 41b, and 41c) that buries the waveguide mesa 75(15). This etching can form the first semiconductor portion 41a, the second semiconductor portion 41b, and the third semiconductor portion 41c of the buried semiconductor region 41 from the first portion M31, the second portion M32, and the third portion M33 of the pattern M3P, respectively. After the etching, the mask M3 is removed.

Referring to FIGS. 12A, 12B, and 12C, a first inorganic insulating film 85 is deposited on the waveguide mesa 75 and on the buried semiconductor region 41 by CVD. The first inorganic insulating film 85 includes a silicon-based inorganic insulator such as $SiO_2$. The first inorganic insulating film 85 covers the upper surface of the waveguide mesa 75 and the upper surface and the side surface of the buried semiconductor region 41.

After the first inorganic insulating film 85 is grown, a buried resin body 87 is formed by coating and etching in accordance with the height of the waveguide mesa 75. The buried resin body 87 includes, for example, BCB resin. The buried resin body 87 has an opening 87a on the upper surface of the waveguide mesa 75 and the upper surface of the buried semiconductor region 41. The first inorganic insulating film 85 appears in the opening 87a.

After the buried resin body 87 is formed, a second inorganic insulating film 89 covering the buried resin body 87 are deposited by CVD. The second inorganic insulating film 89 includes a silicon-based inorganic insulator such as $SiO_2$. The second inorganic insulating film 89 covers the first inorganic insulating film 85 and the buried resin body 87 on the upper surface of the waveguide mesa 75 and on the upper surface of the buried semiconductor region 41.

If necessary, after the second inorganic insulating film 89 is formed, a part of the contact layer 32 in at least one of the first multilayer 17 and the second multilayer 19 can be removed by photolithography and etching.

Figure 13A:
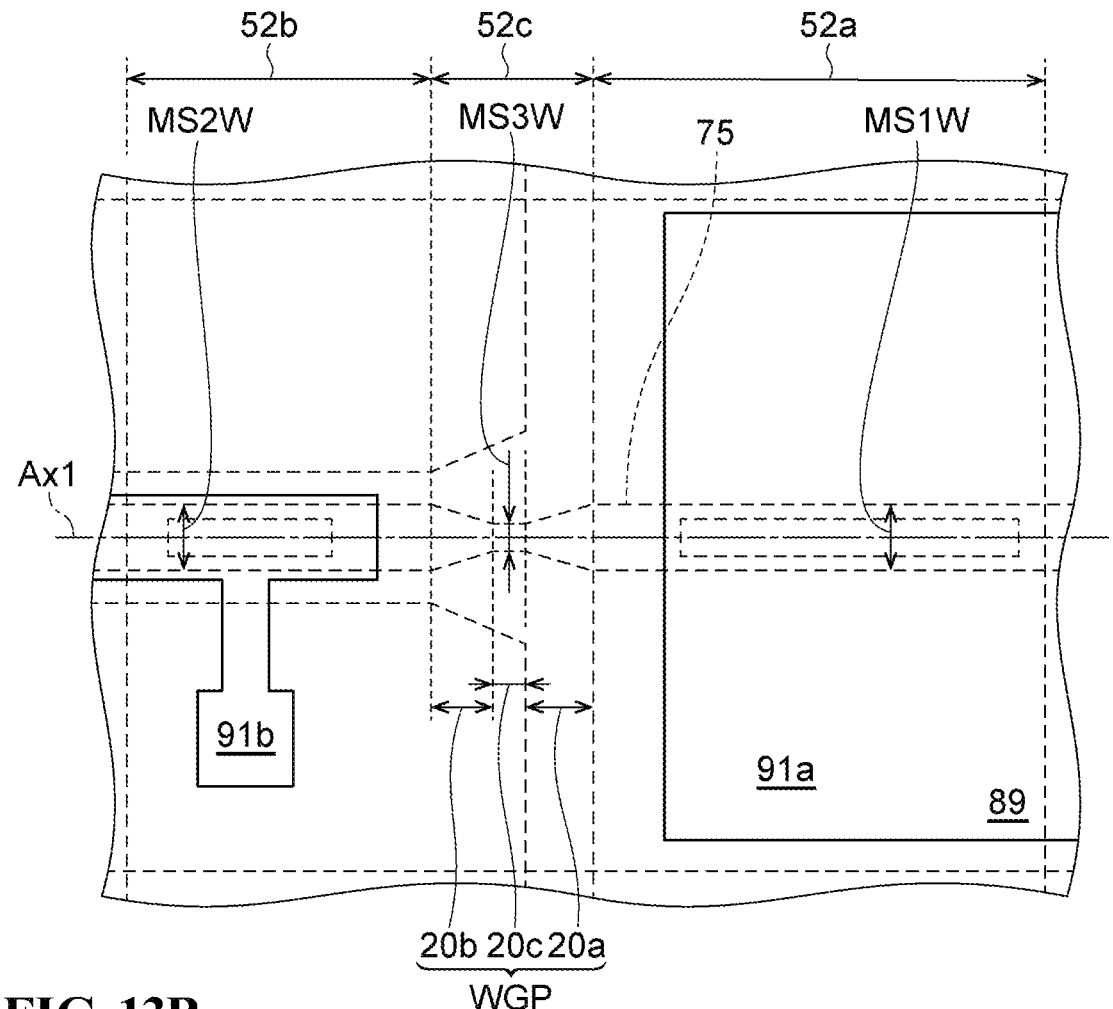
FIG. 13A is a plan view showing a main step in a method of fabricating the semiconductor integrated optical device according to the present embodiment.
Figure 13B:
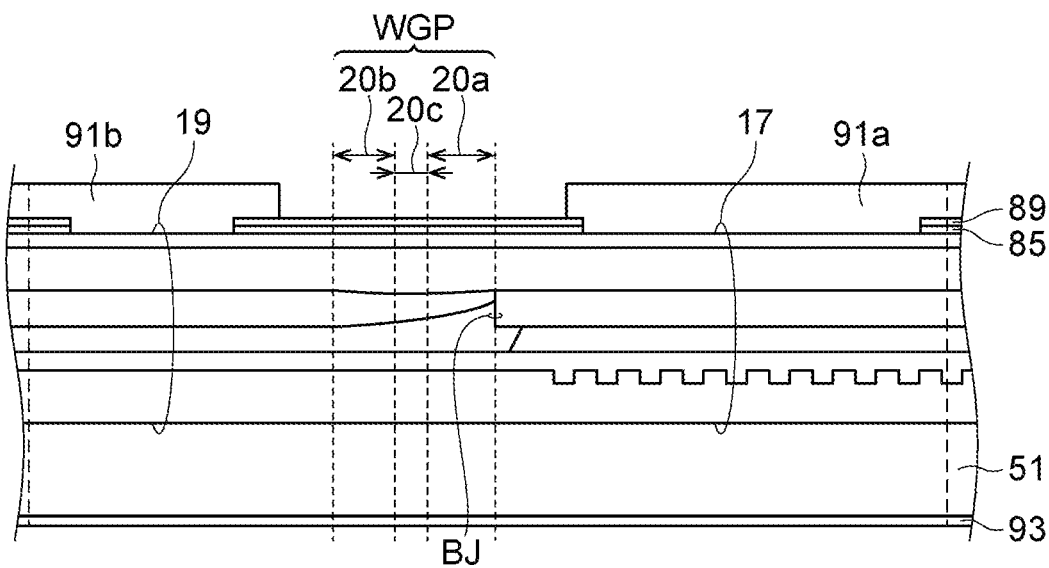
FIG. 13B is a diagram showing a cross-section taken along the waveguide axis in FIG. 13A.

Referring to FIGS. 13A and 13B, metal deposition, lift-off, and plating are used to form a first metal electrode 91a and a second metal electrode 91b for the first and second elements. The first metal electrode 91a and the second metal electrode 91b are located on the first region 52a and the second region 52b, respectively, and are not provided on the third region 52c. A common electrode 93 is formed on a back surface of the substrate 51. The substrate 51 is cleaved to produce a semiconductor integrated optical device 11.

Referring back to FIGS. 1A and 1B, the semiconductor integrated optical device 11 may include a first element such as a semiconductor laser and a second element such as an electro-absorption semiconductor modulation element. The semiconductor integrated optical device 11 has a waveguide portion WGP having a narrow mesa width in the vicinity of a butt-joint interface BJ. This narrow mesa width reduces optical loss caused by a change in film thickness and composition of the second core layer 23a occurring in a range of about 30 to 50 micrometers from the butt-joint interface BJ. Therefore, the waveguide portion WGP in the waveguide mesa 15 has a third mesa width MS3W (scope from 0.4 micrometer to 0.8 micrometer, for example, 0.6 micrometer wide) which is spaced from the position of the butt-joint interface BJ from the first element to the second element. The waveguide portion WGP connects the first multilayer 17 of first mesa width MS1W (e.g., a width of 1.5 micrometers or more) provided on the first region 13a and the second multilayer 19 of second mesa width MS2W (e.g., a width n of less than 1.5 micrometers) provided on the second region 13b. Although the total thickness of the regrown semiconductor layers 23a and 29 is small, the second core layer 23a exhibits a variation in film thickness and composition in the range of distance about 30 to 50 micrometers from the butt-joint interface BJ. Where possible, the waveguide portion WGP includes a core portion 21b on the third region 13c.

The size of the semiconductor integrated optical device 11 is as follows:
First multilayer 21: 400 micrometers long in the direction of the axis Ax1.
Second multilayer 23; 200 micrometers long in the direction of the axis Ax1.
The variation of the film thickness of the waveguide portion WGP can be observed by a transmission electron microscope (TEM). Variations in the composition of the waveguide portion WGP can be observed by the micro-photoluminescence device. In the waveguide portion WGP, the third band gap wavelength shifts from a desired value to a longer wavelength by about 10 to 20 nm. The waveguide portion WGP with a third mesa-width MS3W of 0.6 micrometers enables an optical confinement factor of about 60% compared to the first region 13a and the second region 13b, both 1.5 micrometers wide. The tapered portions 20a, 20b connecting the first multilayer 21 on the first region 13a and the second multilayer 23 on the second region 13b to the narrow mesa portion 20c allow optical losses of less than 0.1 dB, for example with a taper length of 20 micrometers.

While the principles of the invention have been illustrated and described in preferred embodiments, it will be appreciated by those skilled in the art that the disclosure may be modified in arrangement and detail without departing from such principles. The present invention is not limited to the specific configurations disclosed in this embodiment. Therefore, it claims all modifications and variations which come within the scope and spirit of the appended claims.

What is claimed is:
1. A semiconductor integrated optical device comprising:
   a waveguide mesa having a first multilayer including a first core layer of a first element, a second multilayer including a second core layer of a second element, and a butt-joint interface between the first core layer and the second core layer;
   a support having a first region, a second region, and a third region, the support mounting the waveguide mesa; and
   a buried semiconductor region provided on the support, wherein
   the third region is provided between the first region and the second region,
   the first multilayer extends from the butt-joint interface in a direction from the third region to the first region,
   the second multilayer extends from the butt-joint interface in a direction from the third region to the second region,
   the first multilayer has a first mesa width on the first region,
   the second multilayer has a second mesa width on the second region,
   on the third region, the second multilayer has a waveguide portion having a third mesa width smaller than the first mesa width and the second mesa width,
   the second core layer has a waveguide core thickness on the second region,
   in the waveguide portion, the second core layer has a core portion having a thickness different from the waveguide core thickness at a position away from the butt joint interface.

2. The semiconductor integrated optical device according to claim 1, wherein
   the waveguide mesa has a lower cladding layer provided on the first region, the second region, and the third region and shared by the first and second multilayers,
   the first core layer and the second core layer are provided on the lower cladding layer,
   the first multilayer has a first upper cladding layer on the first core layer,
   the second multilayer has a second upper cladding layer on the second core layer,
   the second core layer is provided on an end surface of the first upper cladding layer and on an end surface of the first core layer in the butt-joint interface,
   the core portion is provided on the lower cladding layer,
   the waveguide mesa has a third upper cladding layer on the first region, the second region, and the third region, and the first and second multilayers share the third upper cladding layer.

3. The semiconductor integrated optical device according to claim 1, further comprising:
   a first electrode connected to the first multilayer on the first region; and
   a second electrode connected to the second multilayer on the second region,
   wherein
   the first core layer includes an active layer of a light emitting element, and
   the second core layer includes a light absorbing layer of an electro-absorption modulator.

4. A method of fabricating a semiconductor integrated optical device, comprising the steps of:
   preparing an epitaxial substrate including a first multilayer for a first element, a second multilayer including a second core layer for a second element, a butt-joint interface between the first and second multilayers, and a substrate having a first region, a second region, and a third region, the third region being provided between the first region and the second region;
   forming a waveguide mask on the epitaxial substrate, the waveguide mask having a waveguide pattern extending across the butt joint interface in a direction from the first multilayer to the second multilayer; and
   forming a waveguide mesa by etching the epitaxial substrate using the waveguide mask, the waveguide mesa having the first multilayer, the second multilayer, and the butt-joint interface, the first multilayer extending from the butt-joint interface in a direction from the third region to the first region, the second multilayer extending from the butt-joint interface in a direction from the third region to the second region, the first multilayer having a first mesa width on the first region, the second multilayer having a second mesa width on the second region, on the third region, the second multilayer having a waveguide portion having a third mesa width smaller than the first mesa width and the second mesa width, the second core layer having a waveguide core thickness on the second region, in the waveguide portion, the second core layer has a core portion having a thickness different from the waveguide core thickness at a position away from the butt-joint interface.

5. The method of fabricating a semiconductor integrated optical device according to claim 4, wherein
   preparing the epitaxial substrate includes;
      growing a lower laminate on the first to the third regions, the lower laminate including a lower cladding layer for the first and second elements, a first core layer for the first element, and a first upper cladding layer for the first element;
      forming a mask on the lower laminate, the mask covering the first region, the mask having an opening on the second and third regions;
      etching the lower laminate using the mask to form a butt joint mesa on the first region; and
      selectively growing an upper laminate using the mask to form the butt-joint interface, the upper laminate including the second core layer for the second element and a second upper cladding layer for the second element, and
   the second core layer has a composition on the third region different from a composition at the position away from the butt joint interface.

* * * * *